United States Patent
Sirinorakul et al.

(10) Patent No.: US 7,060,535 B1
(45) Date of Patent: Jun. 13, 2006

(54) FLAT NO-LEAD SEMICONDUCTOR DIE PACKAGE INCLUDING STUD TERMINALS

(75) Inventors: Saravuth Sirinorakul, Bangkok (TH); Somchai Nondhasitthichai, Bangkok (TH); Sitta Jewjaitham, Bangkok (TH)

(73) Assignee: NS Electronics Bangkok (1993) Ltd., Bangkok (TH)

( * ) Notice: Subject to any disclaimer, the term of this patent is extended or adjusted under 35 U.S.C. 154(b) by 77 days.

(21) Appl. No.: 10/696,380

(22) Filed: Oct. 29, 2003

(51) Int. Cl.
*H01L 21/44* (2006.01)

(52) U.S. Cl. ...................................... 438/123; 257/702

(58) Field of Classification Search ................ 438/123; 257/700, 701, 702, E23.119, E23.015
See application file for complete search history.

(56) References Cited

U.S. PATENT DOCUMENTS

| | | | |
|---|---|---|---|
| 5,567,984 A | * | 10/1996 | Zalesinski et al. .......... 257/697 |
| 5,693,573 A | * | 12/1997 | Choi ........................... 438/121 |
| 6,031,292 A | * | 2/2000 | Murakami et al. .......... 257/778 |
| 6,713,849 B1 | | 3/2004 | Hasebe et al. ............... 257/667 |
| 6,812,552 B1 | | 11/2004 | Islam et al. .................. 257/666 |

\* cited by examiner

*Primary Examiner*—Caridad Everhart
(74) *Attorney, Agent, or Firm*—Silicon Valley Patent Group LLP

(57) ABSTRACT

A flat no-lead semiconductor die package contains a plurality of studs that protrude from the bottom surface of the capsule and act as electrical contacts, allowing the package to be mounted on a flat surface such as a printed circuit board, while permitting external circuit to be located on the flat surface directly beneath the package. The package may or may not contain a die-attach pad. The die may be mounted flip-chip style on the stud contacts and die-attach pad. A method of fabricating the package includes etching an upper portion of a metal sheet through a mask layer, attaching dice at locations on the surface of the metal sheet, forming a layer of molding compound over the dice, etching the lower portion of the metal sheet through a second mask layer, and separating the packages with a dicing saw or punch tool.

37 Claims, 43 Drawing Sheets

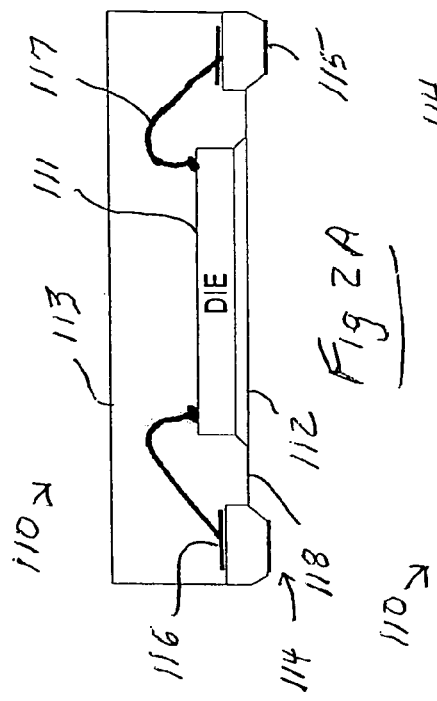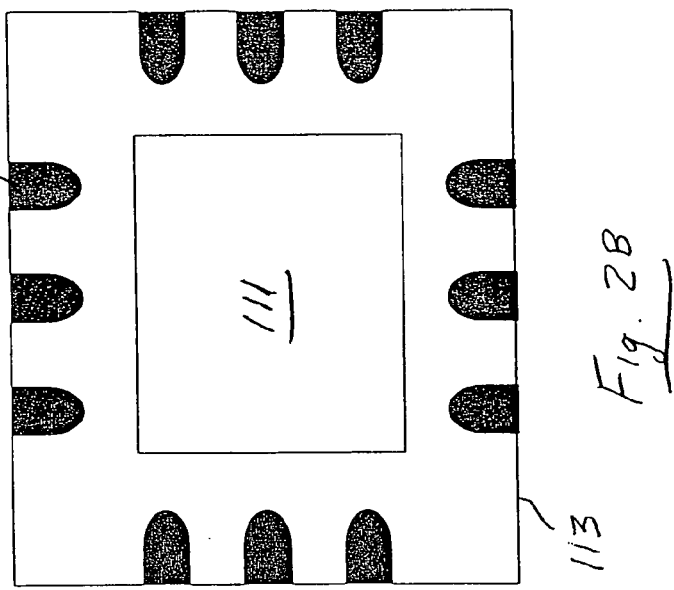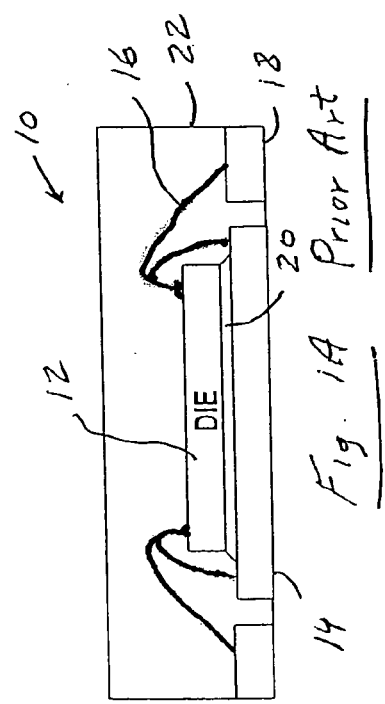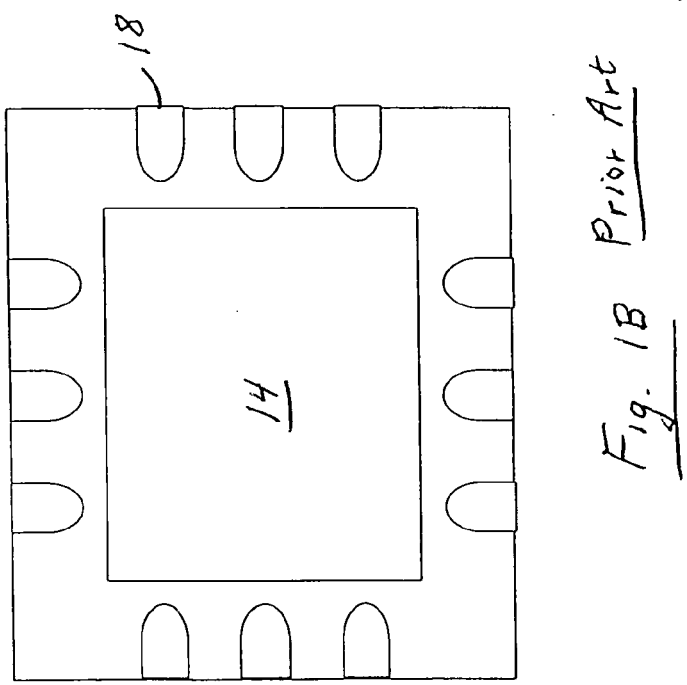

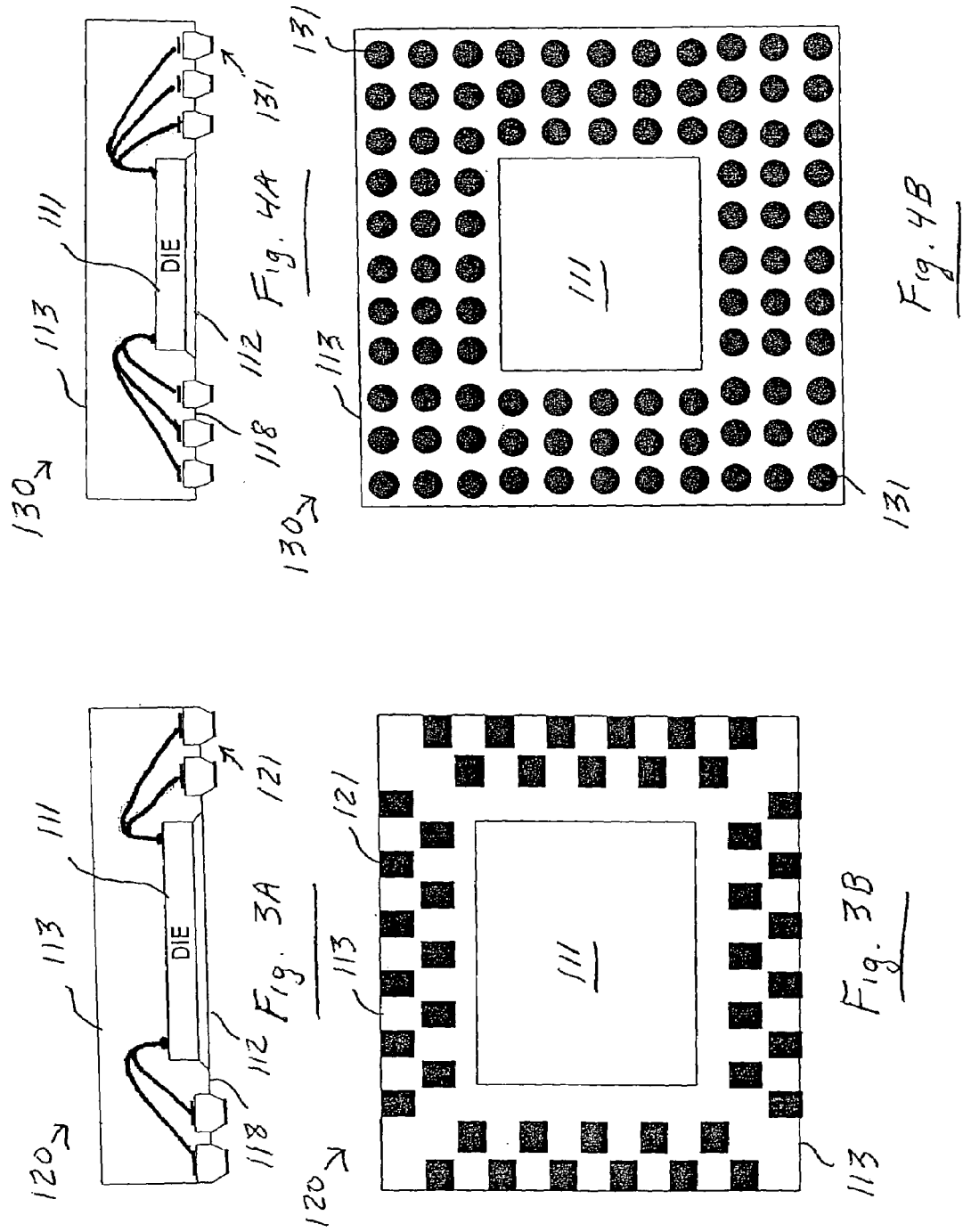

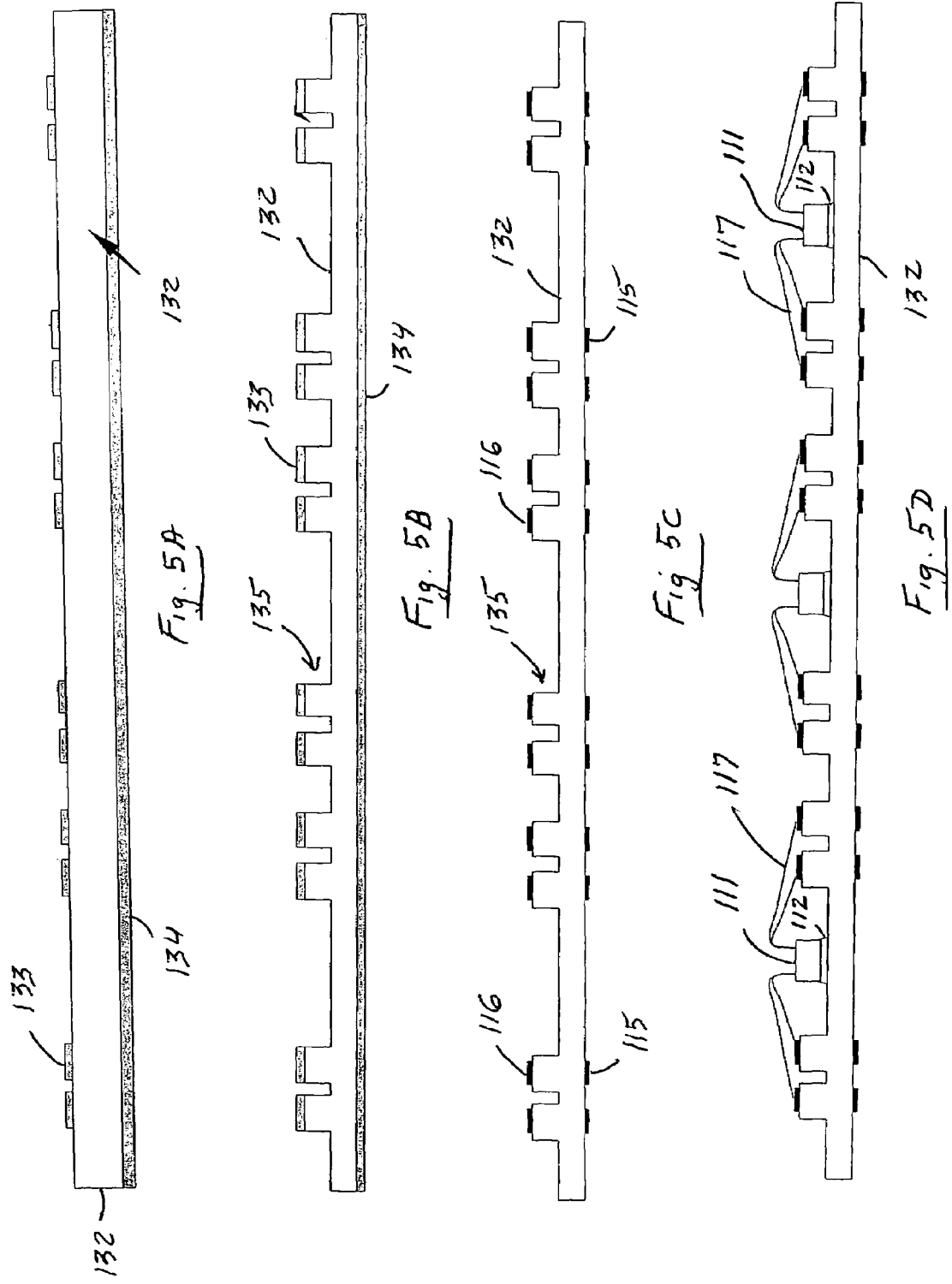

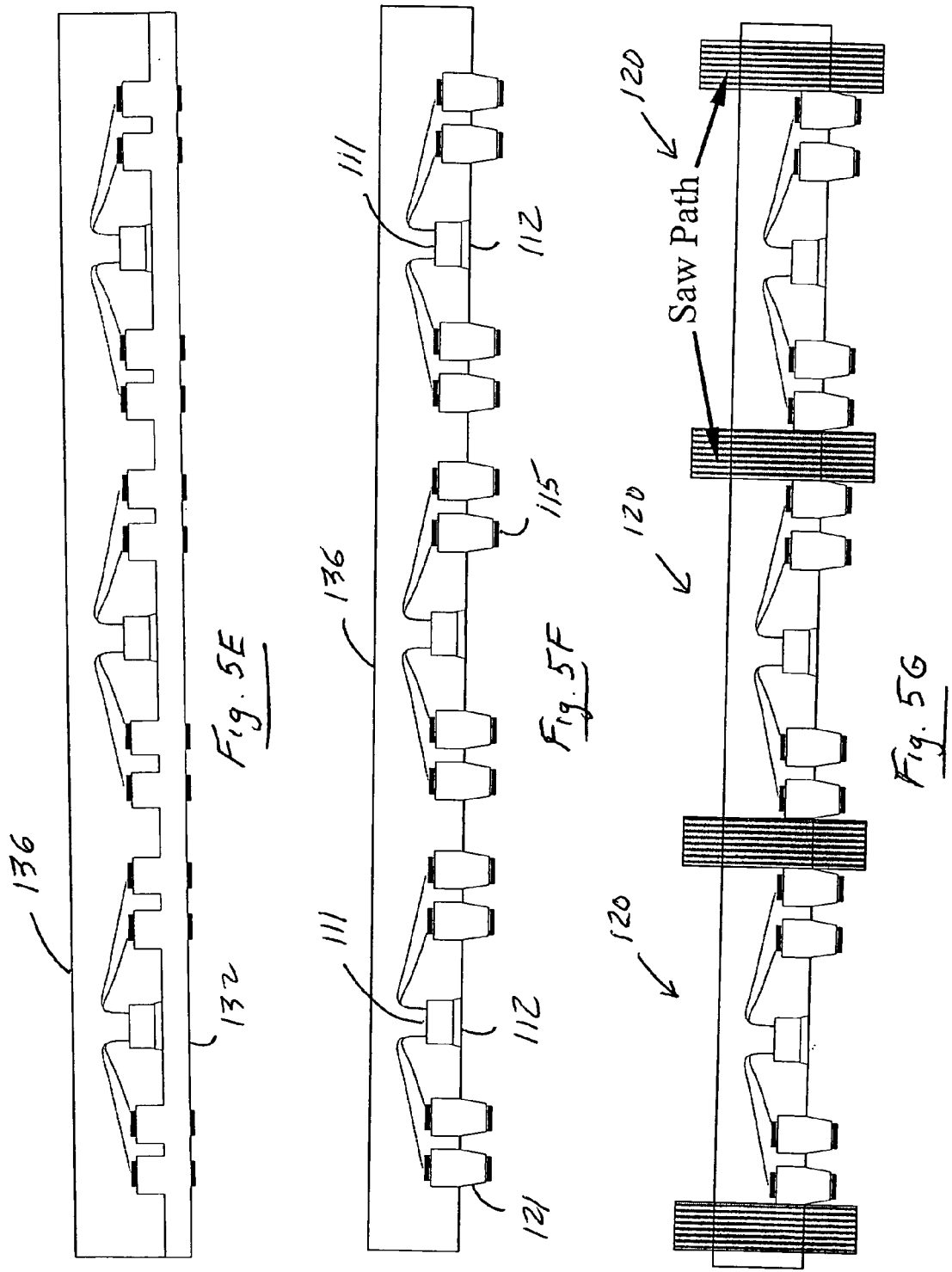

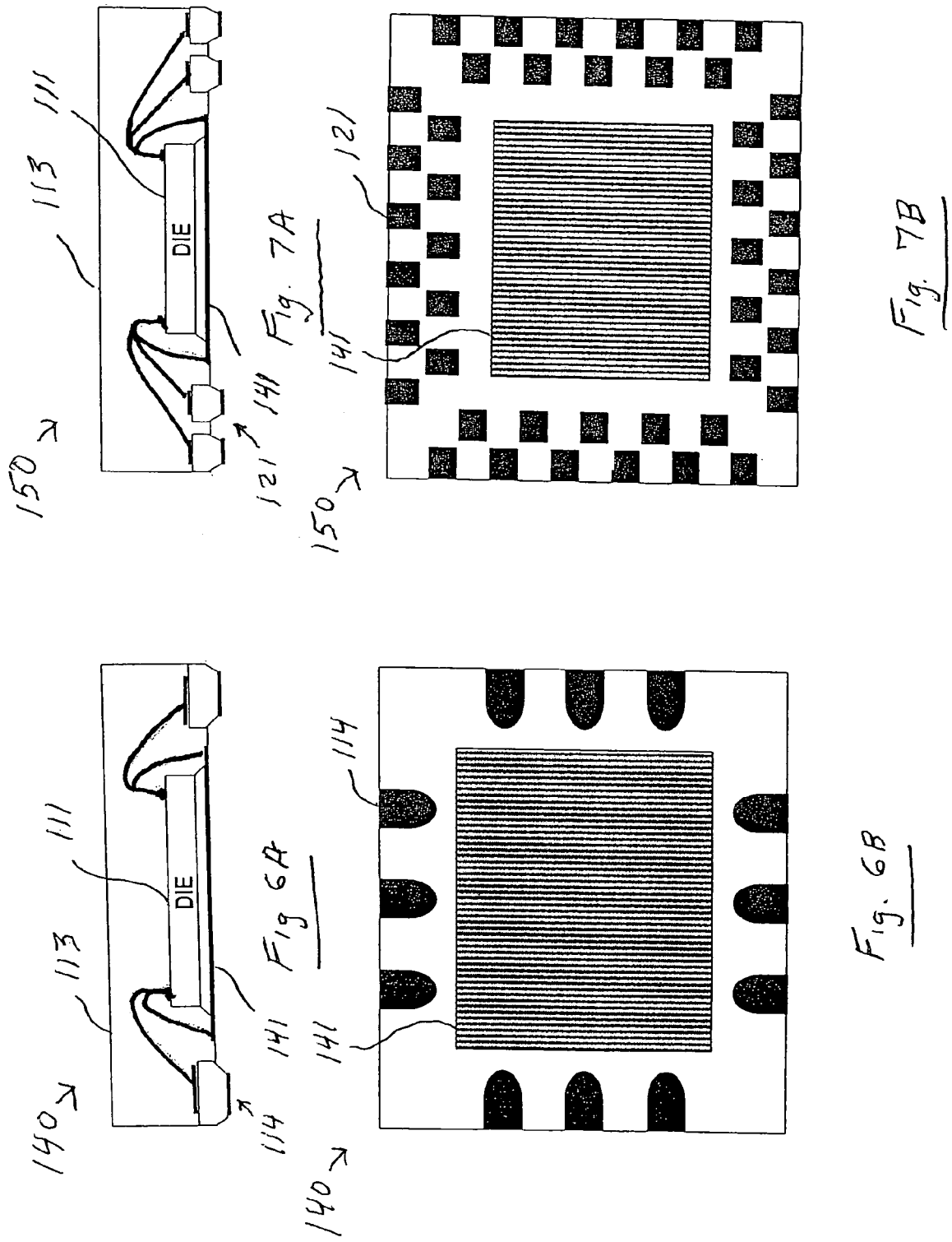

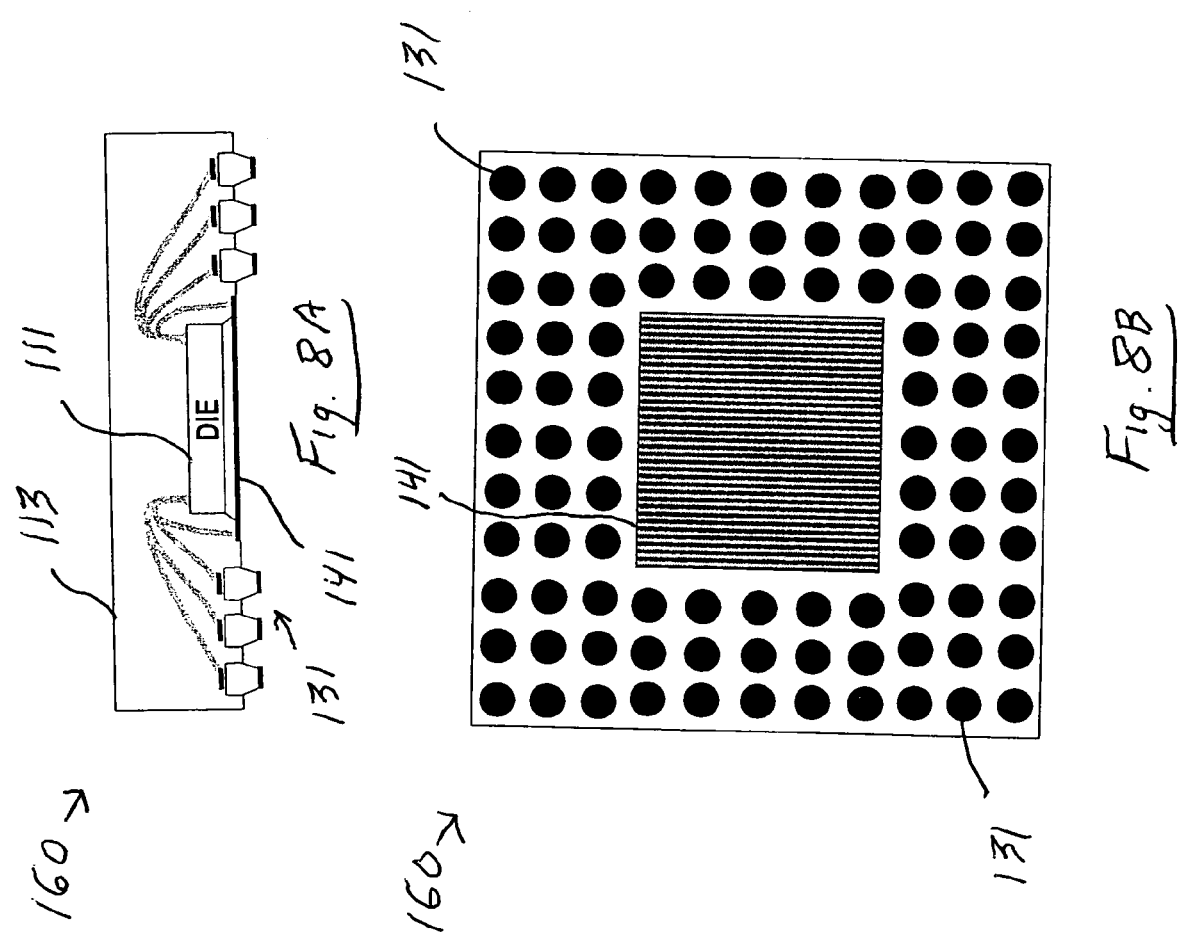

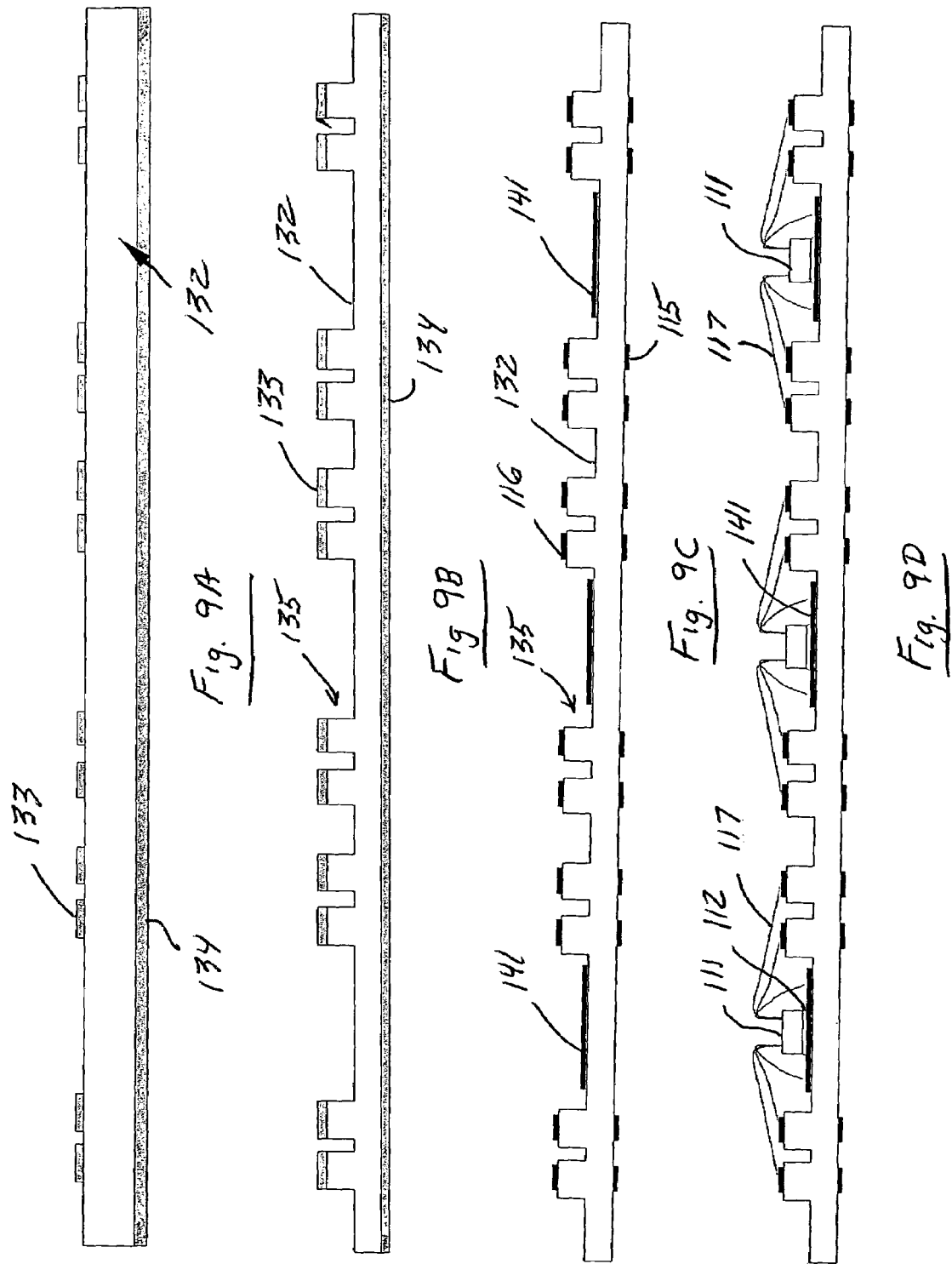

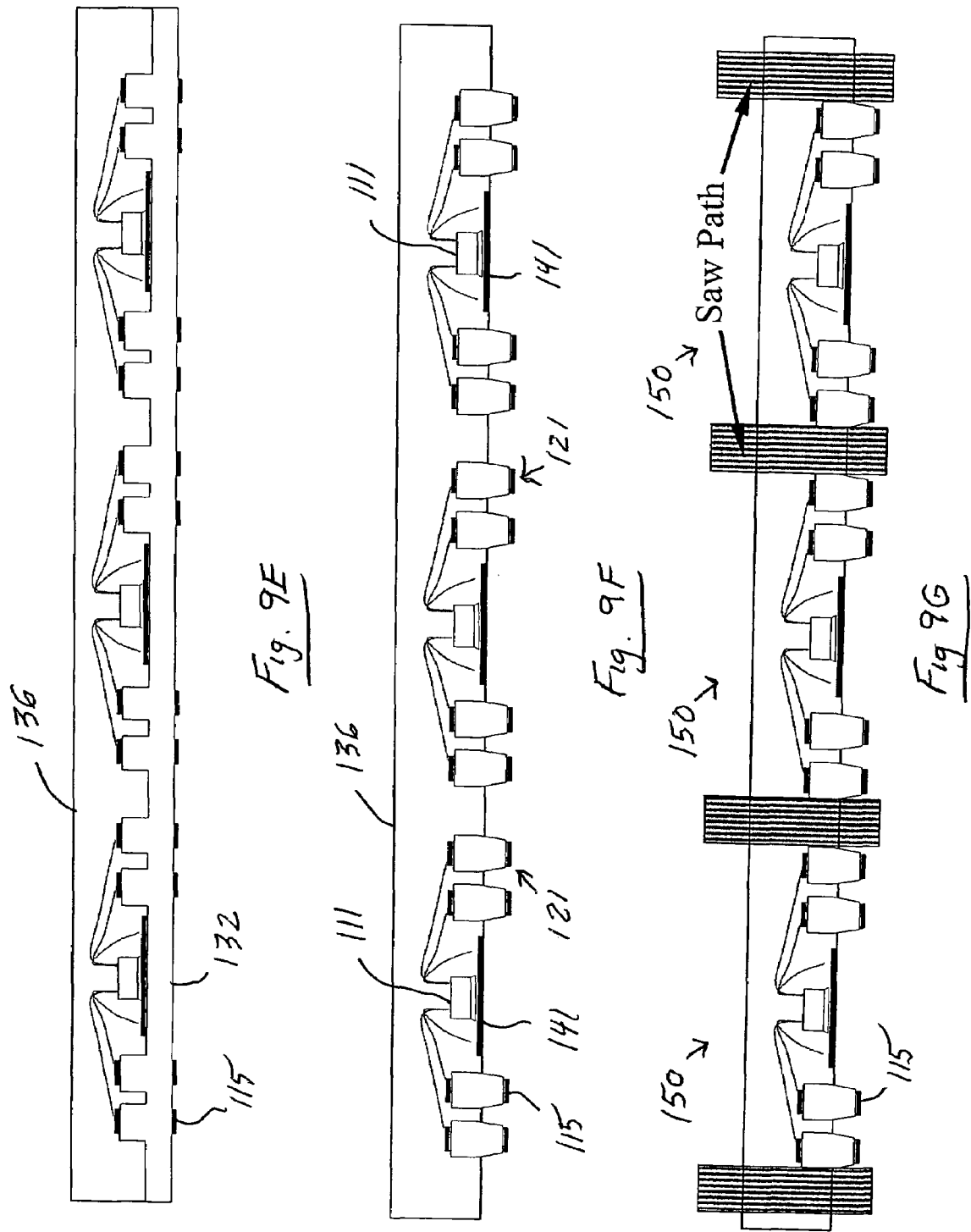

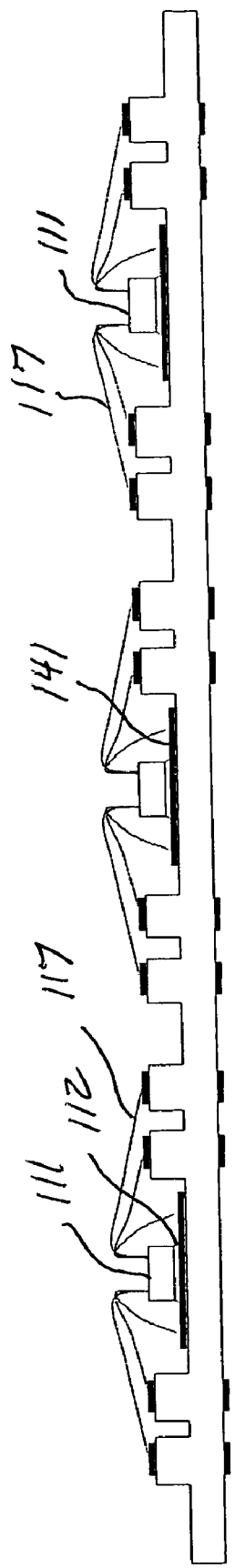
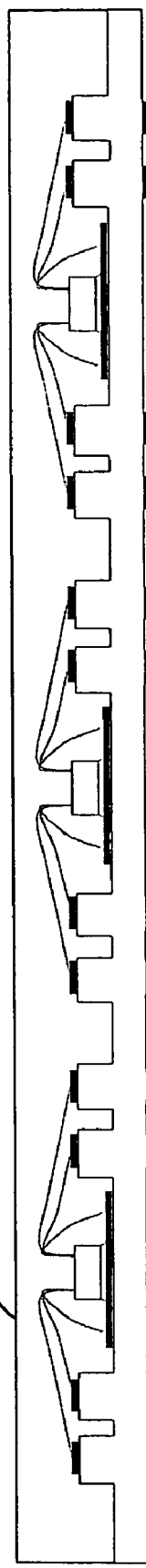
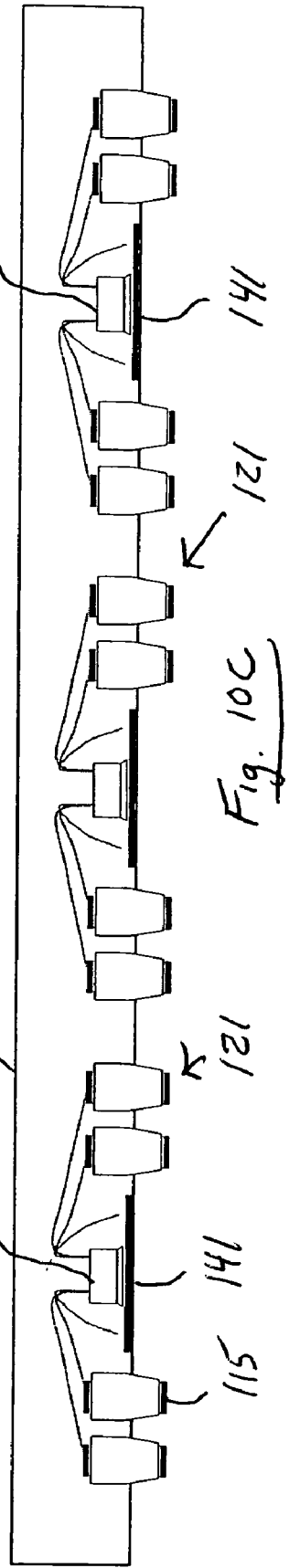
Fig. 10A
Fig. 10B
Fig. 10C

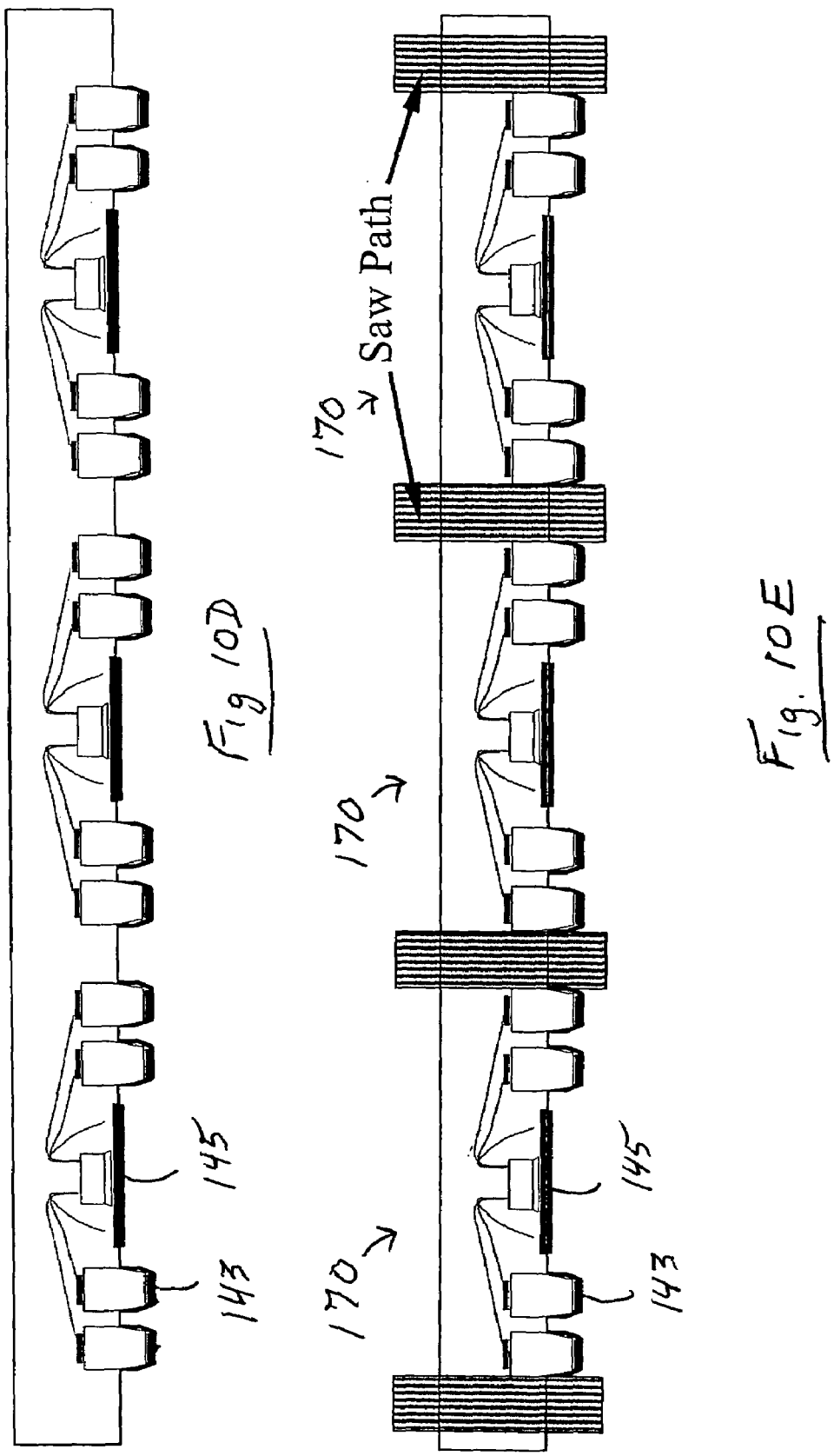

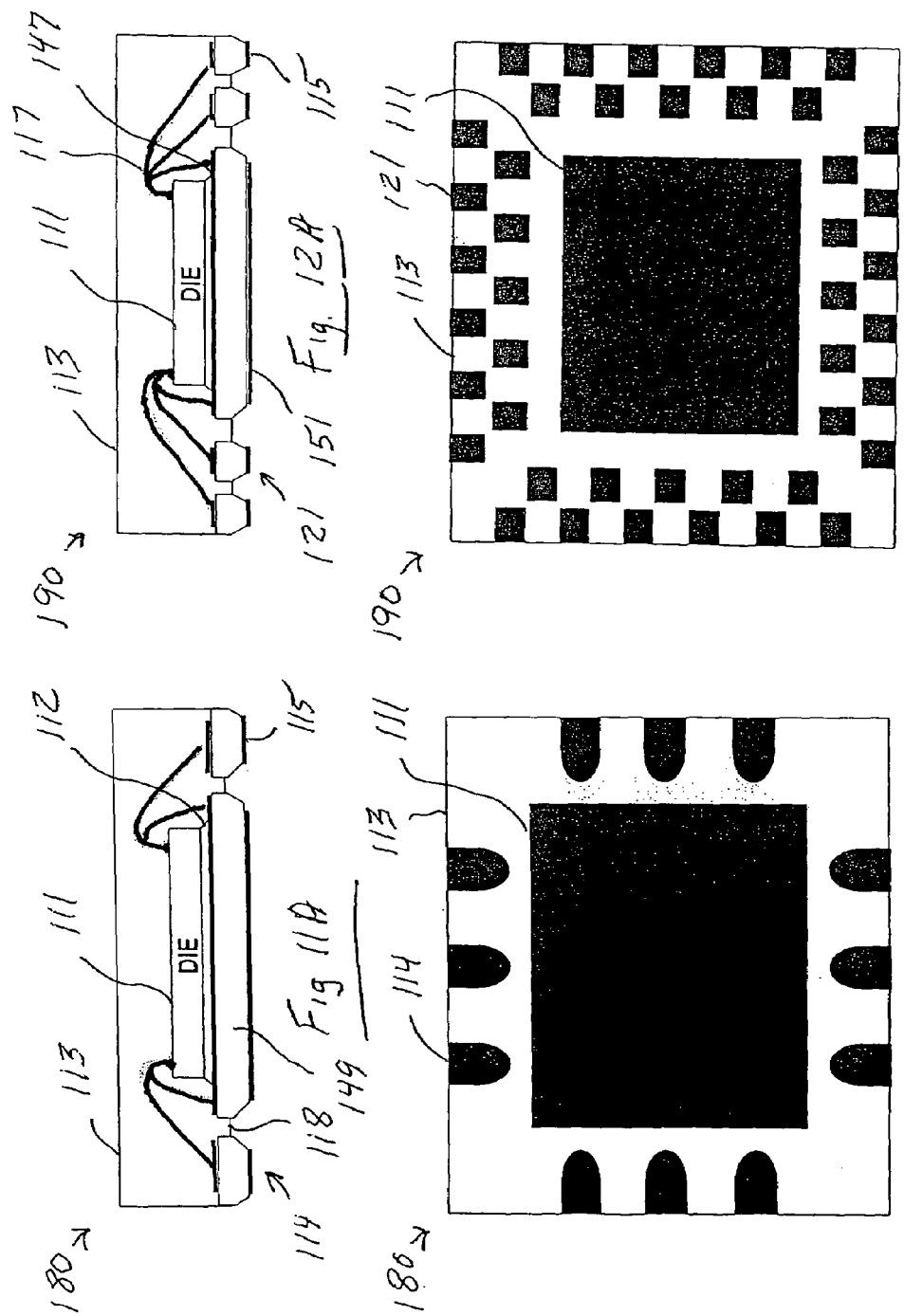

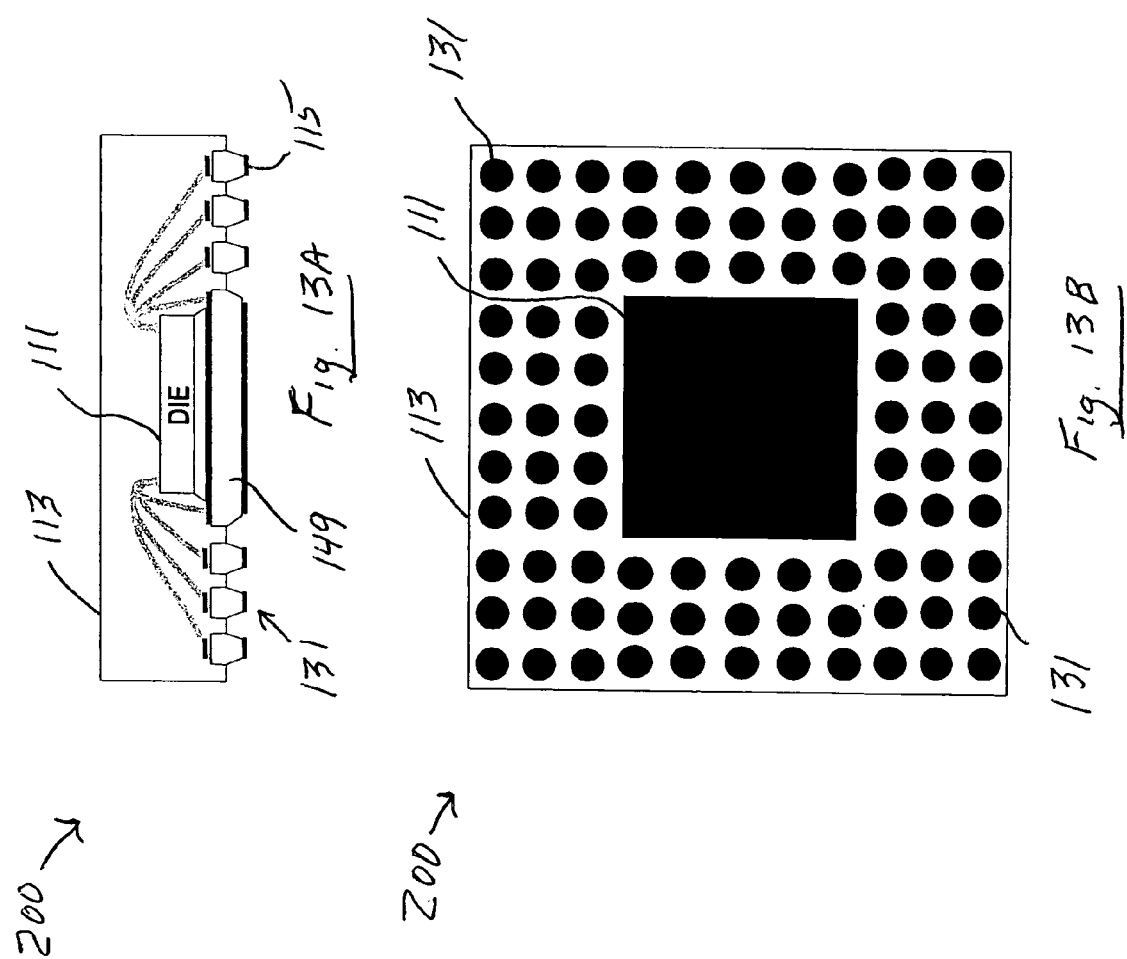

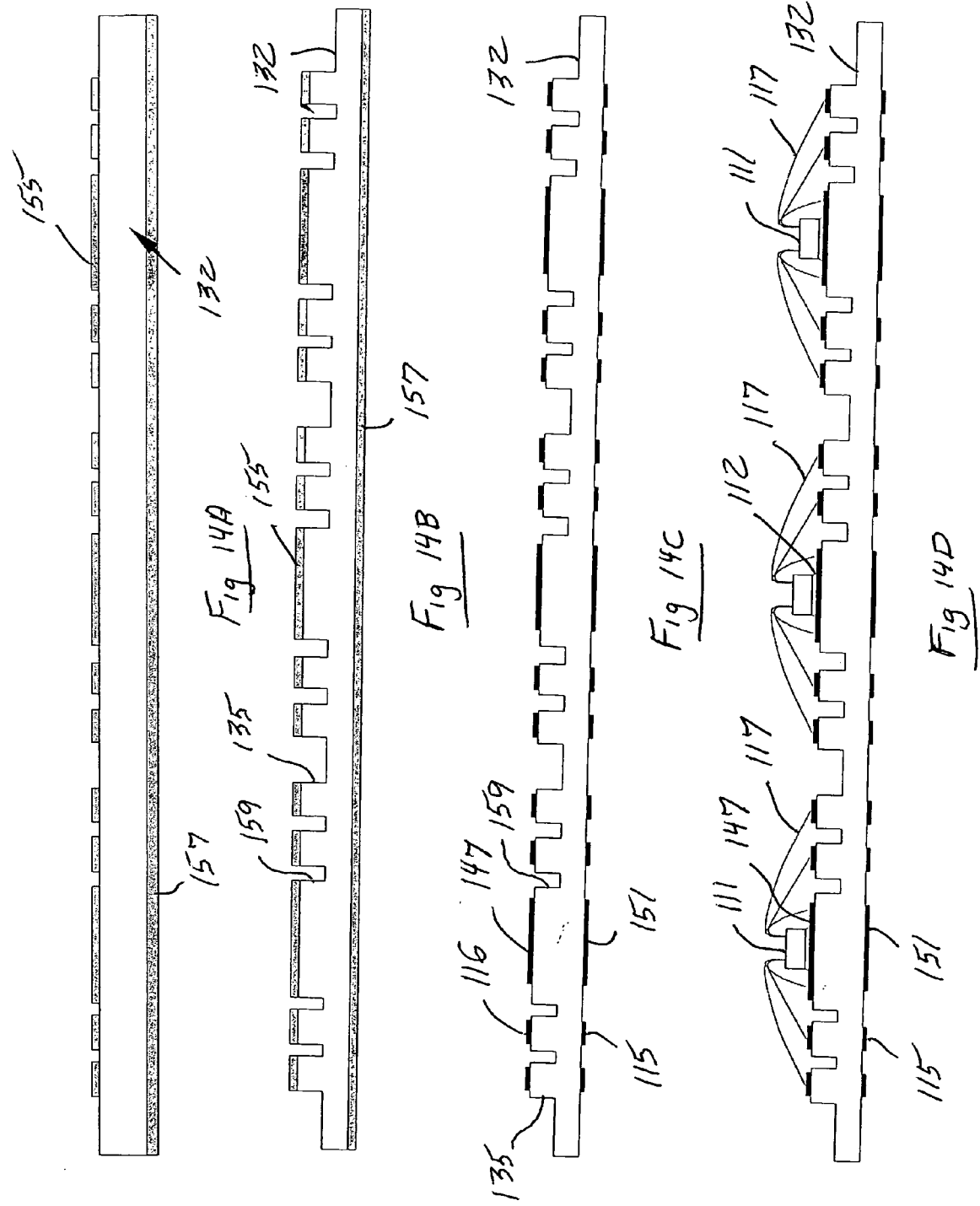

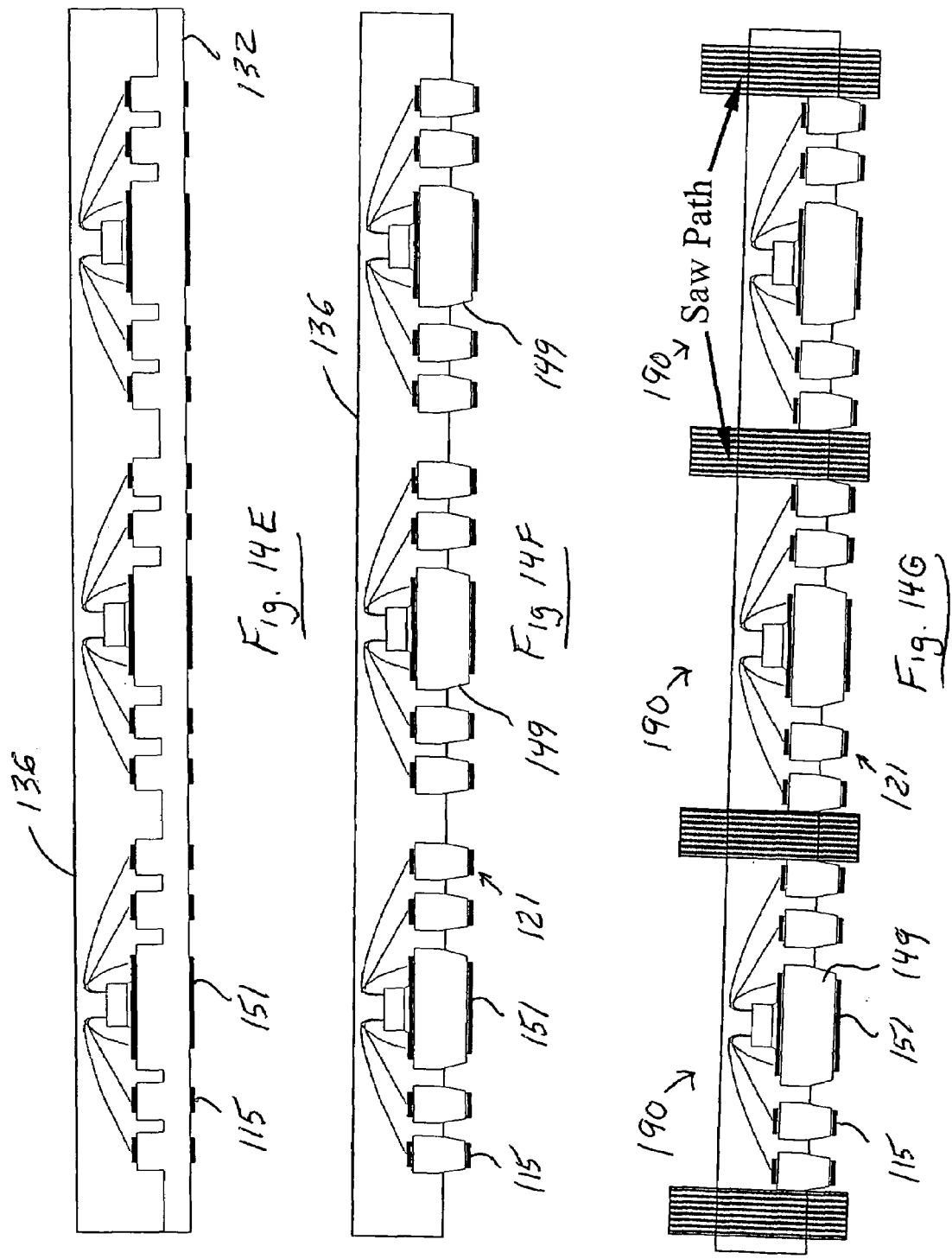

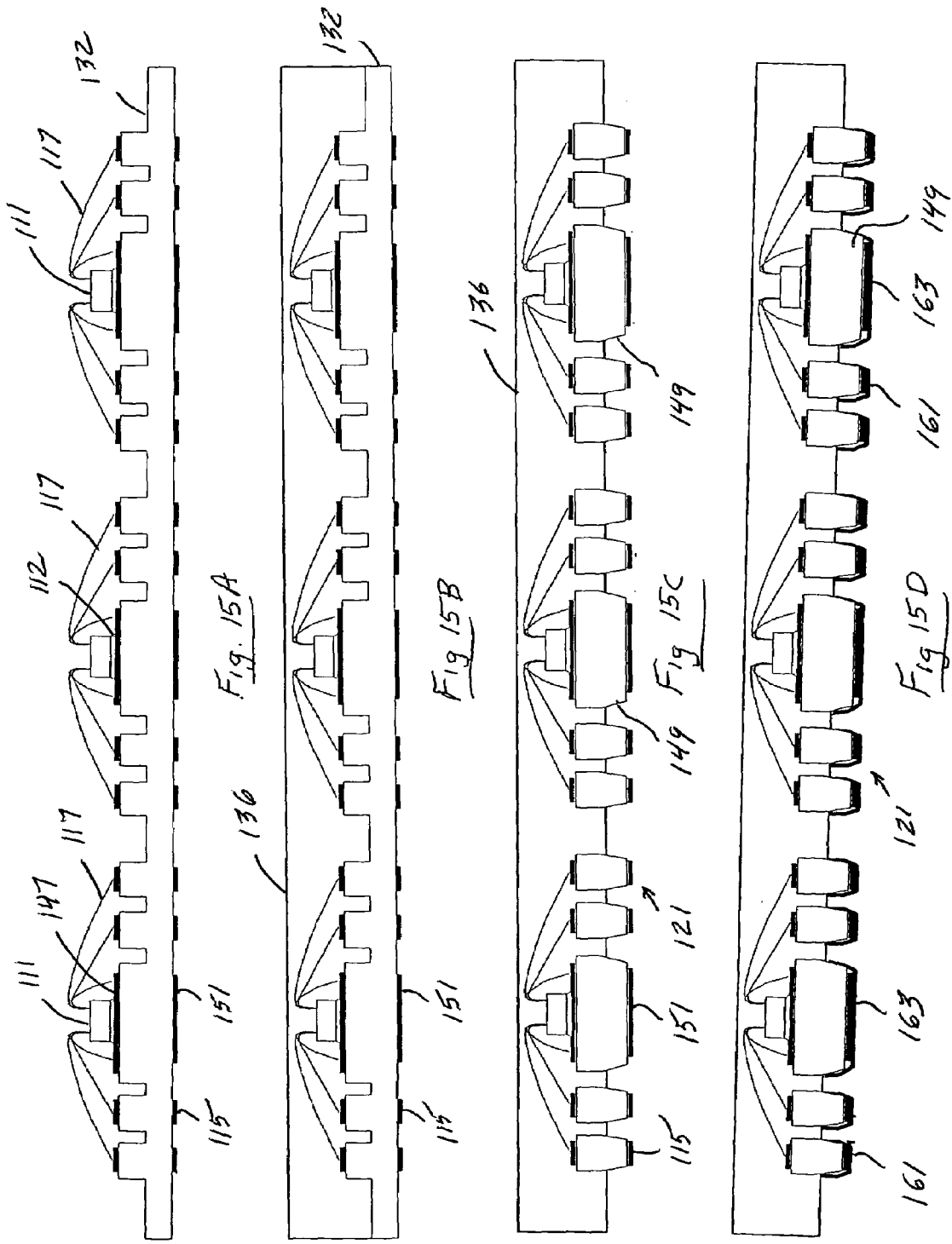

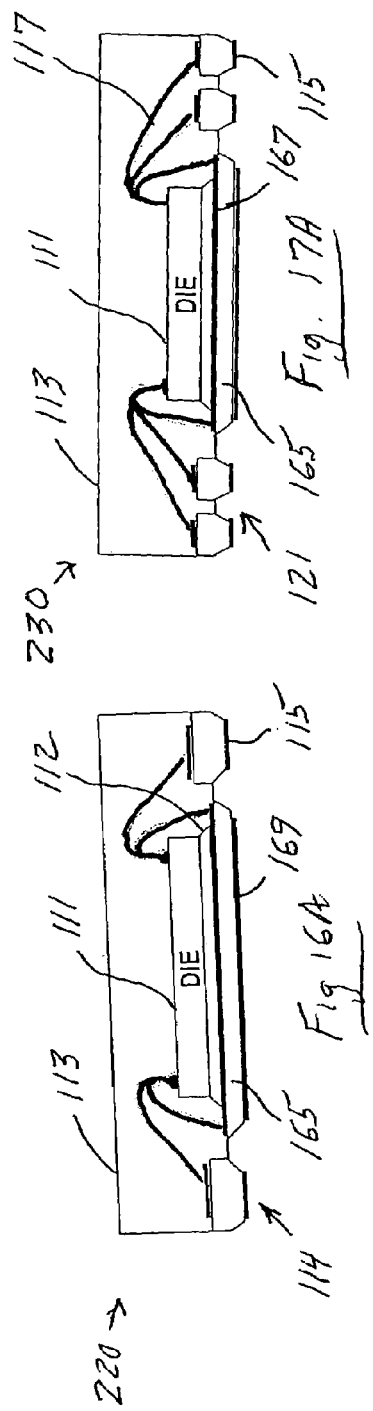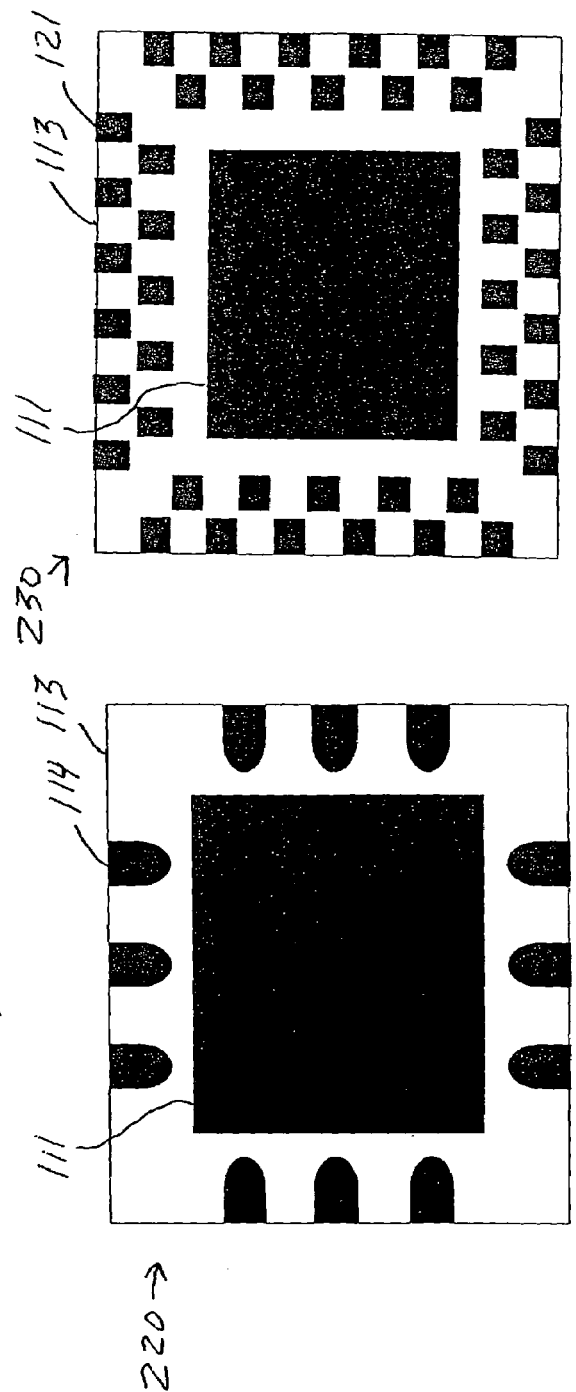

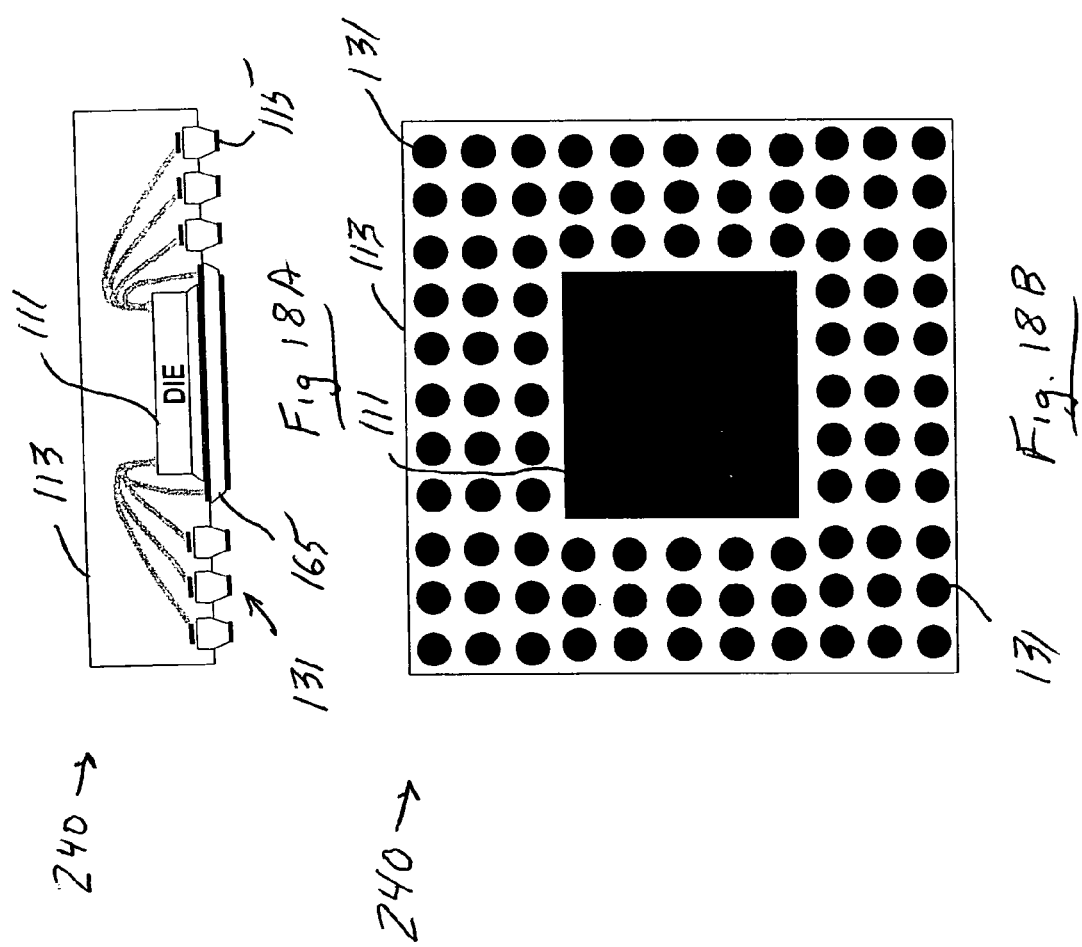

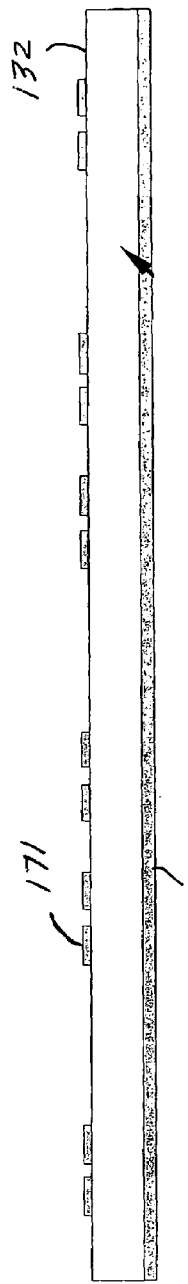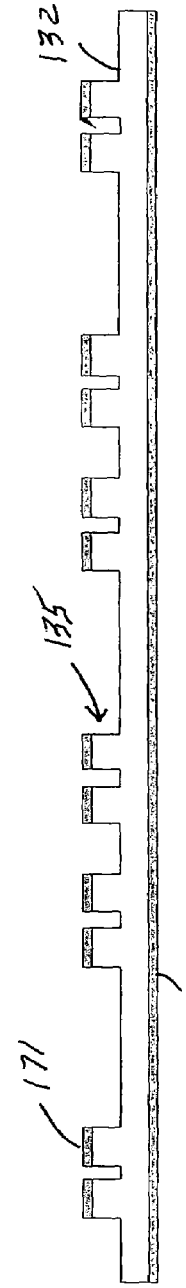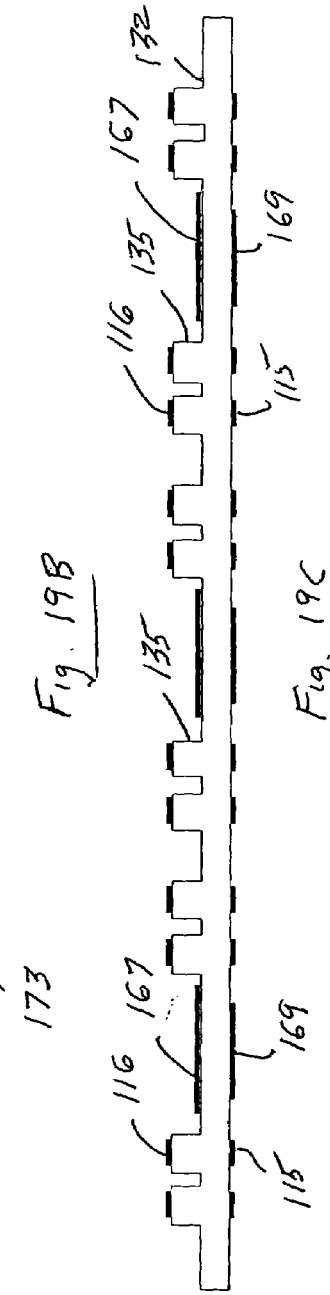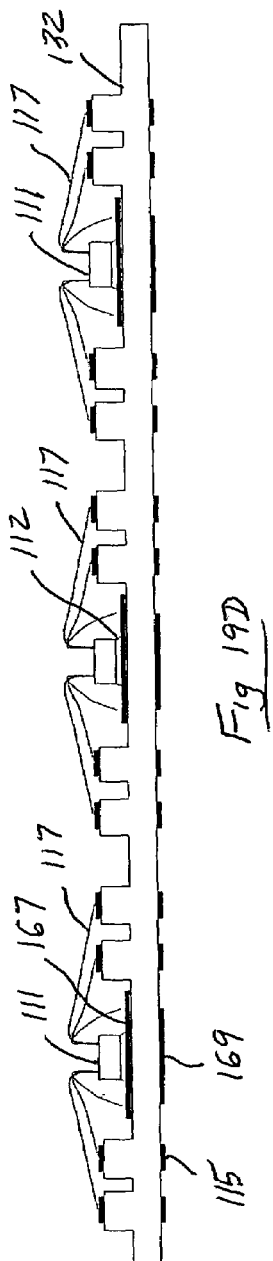

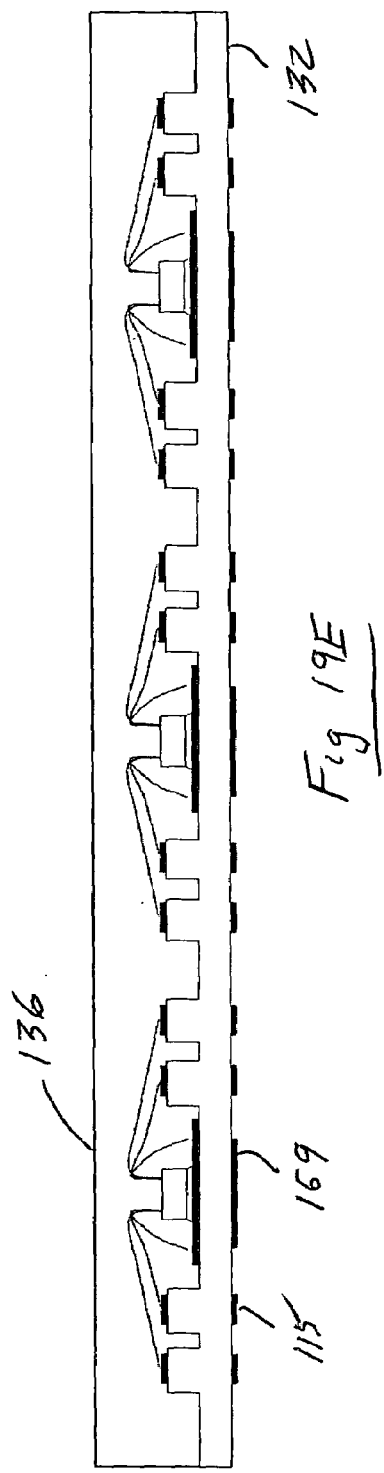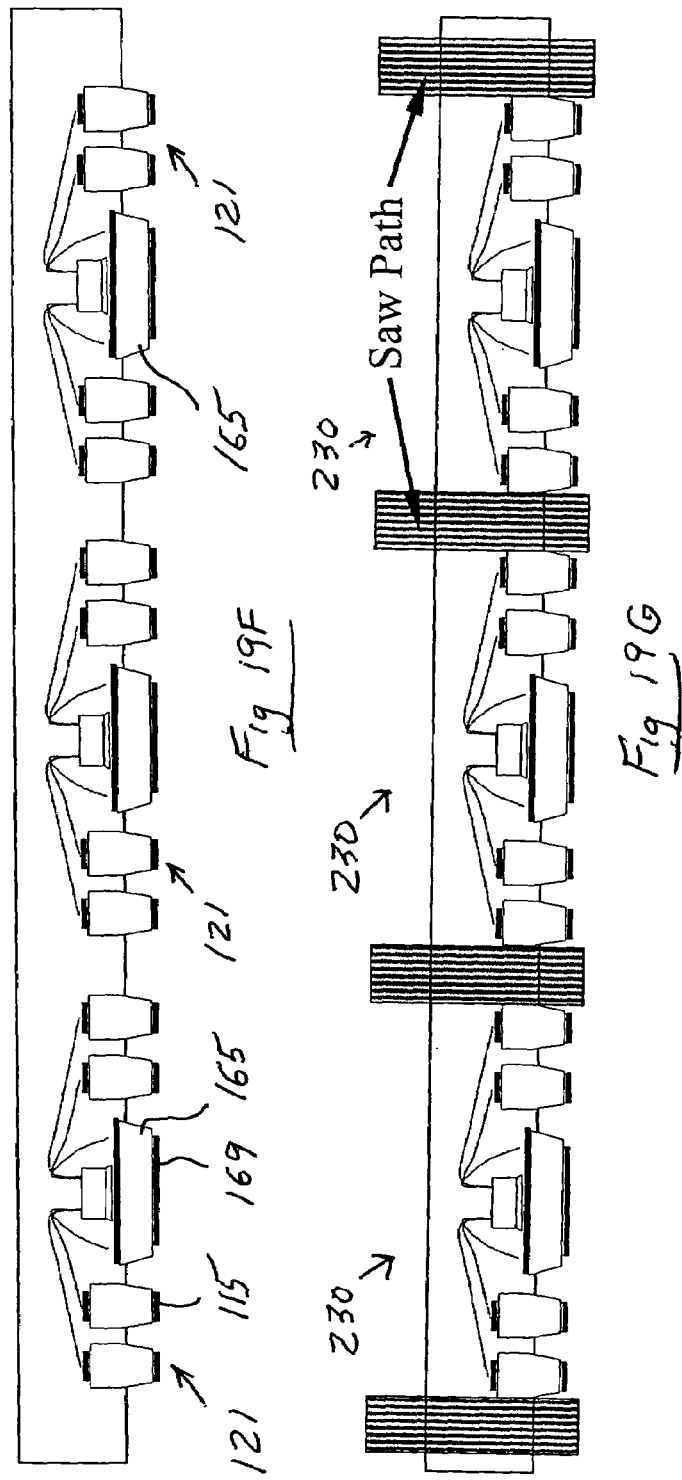

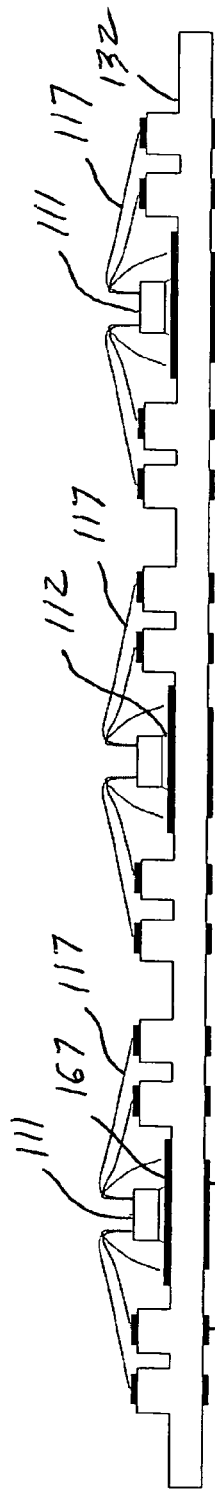
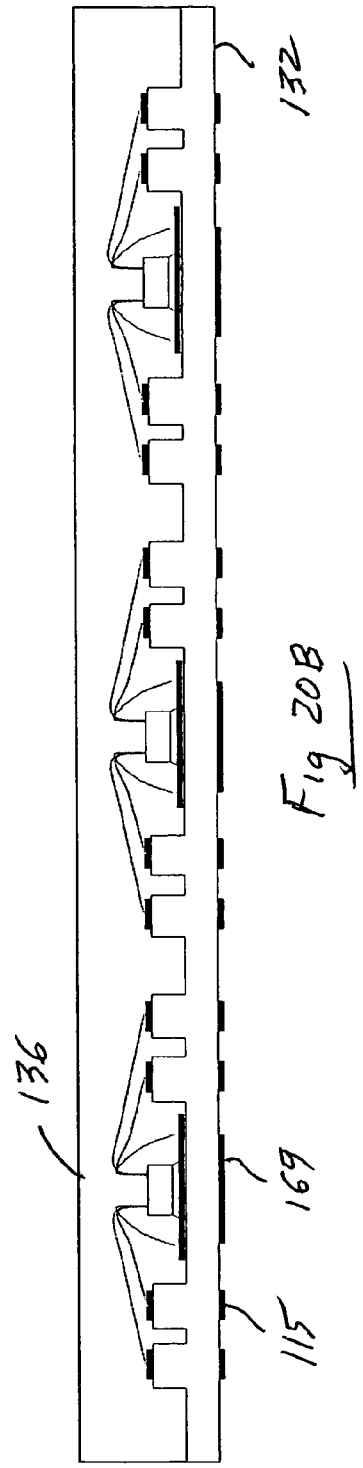
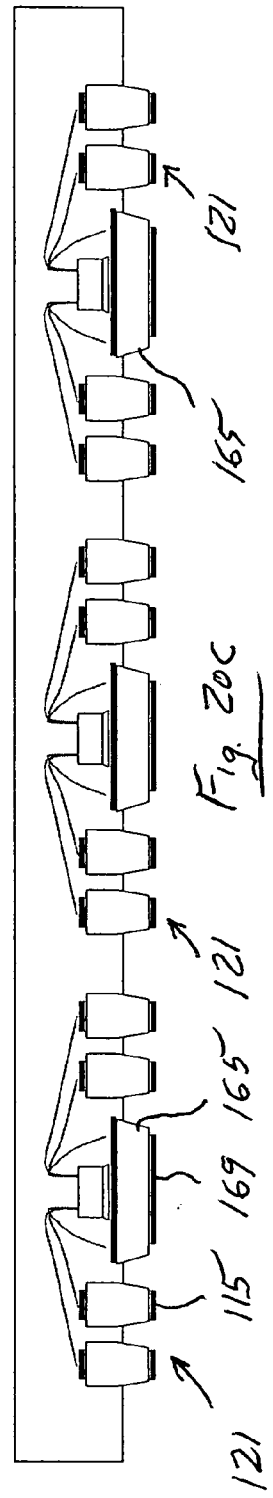
Fig. 20A
Fig. 20B
Fig. 20C

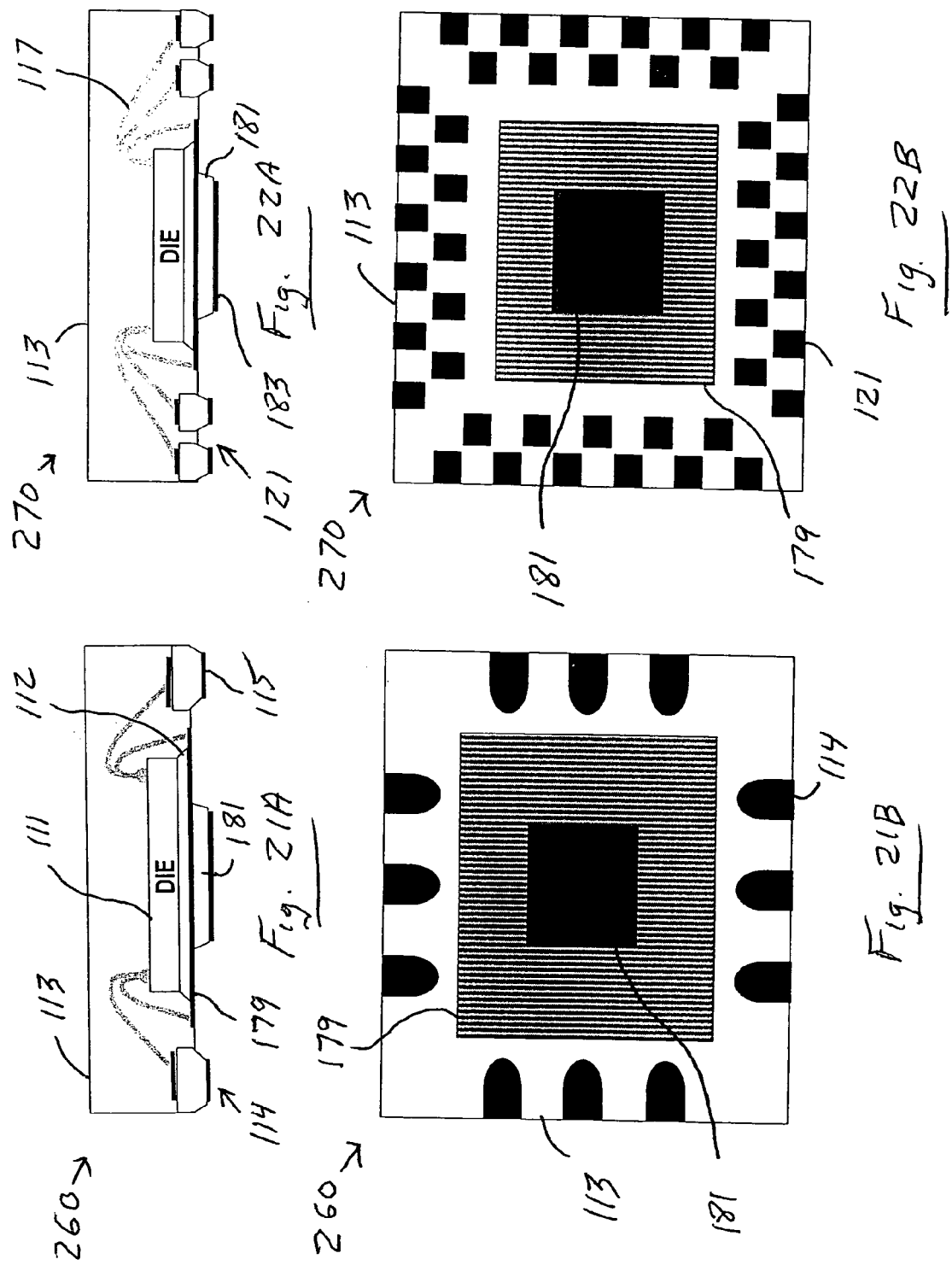

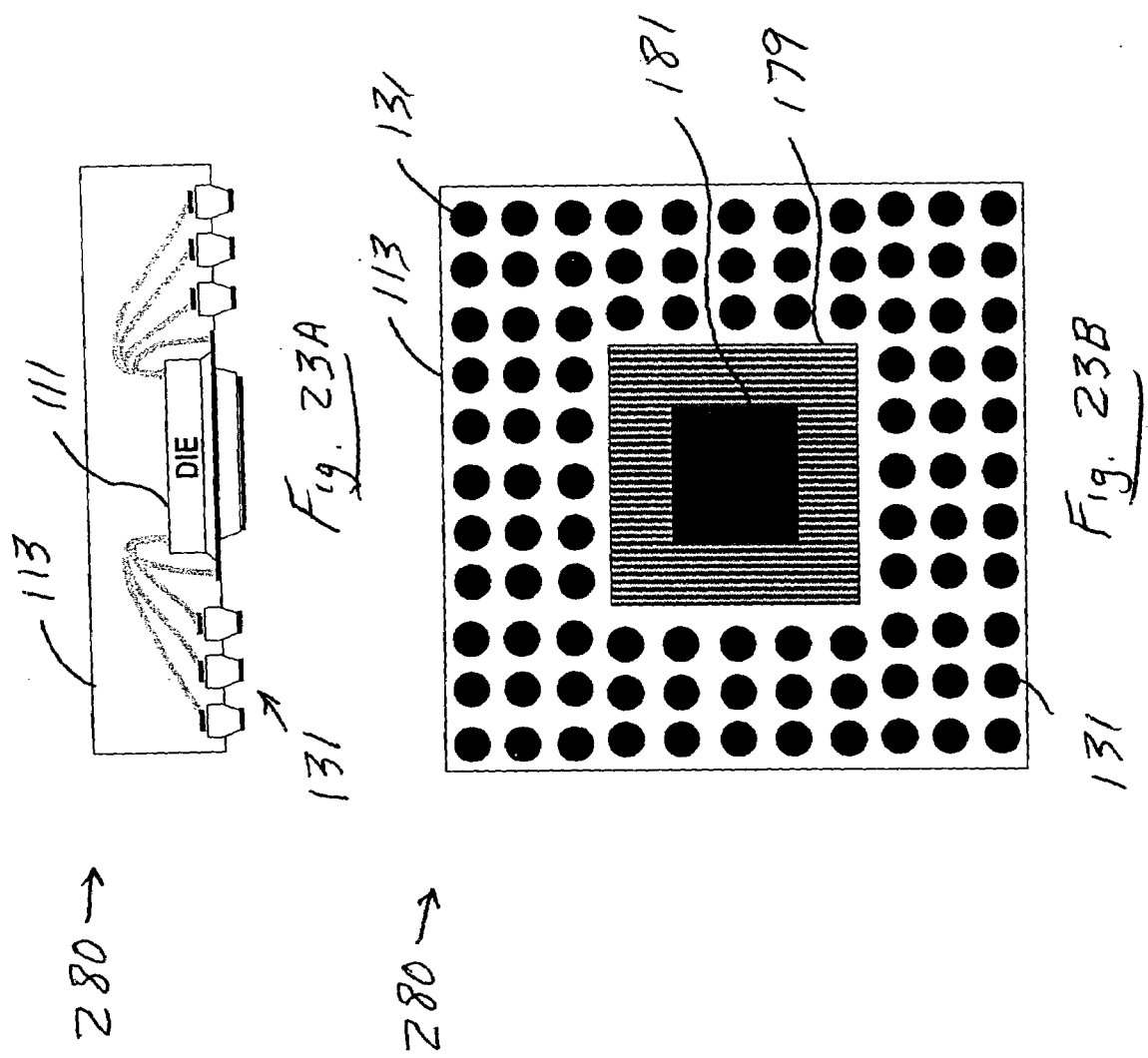

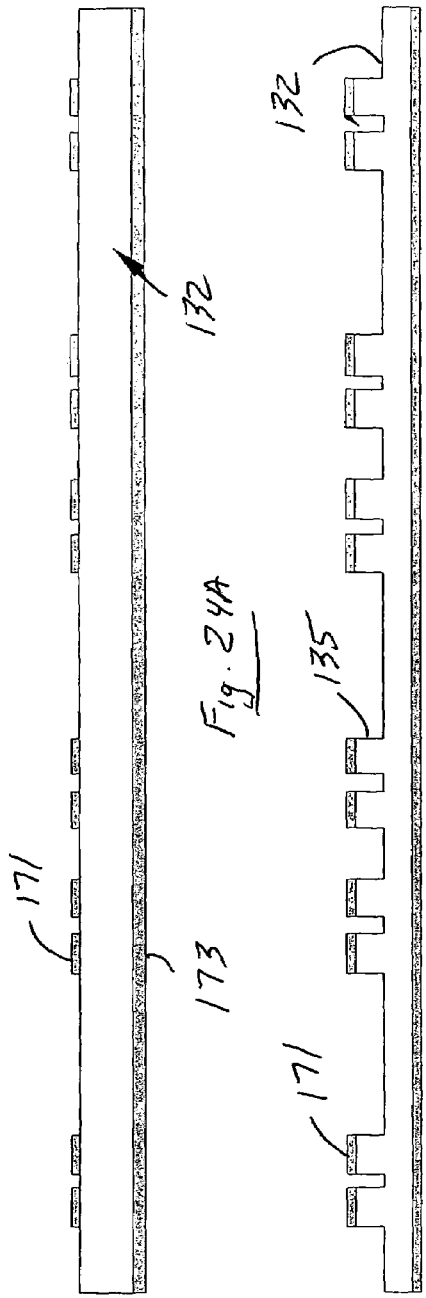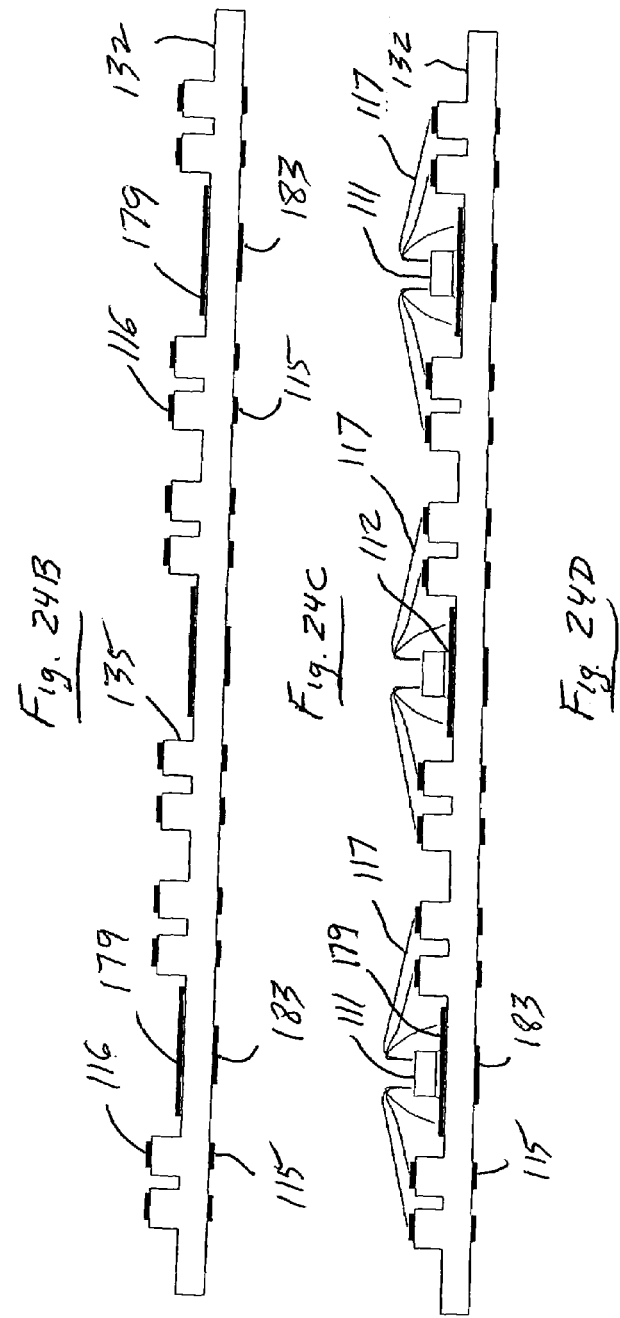

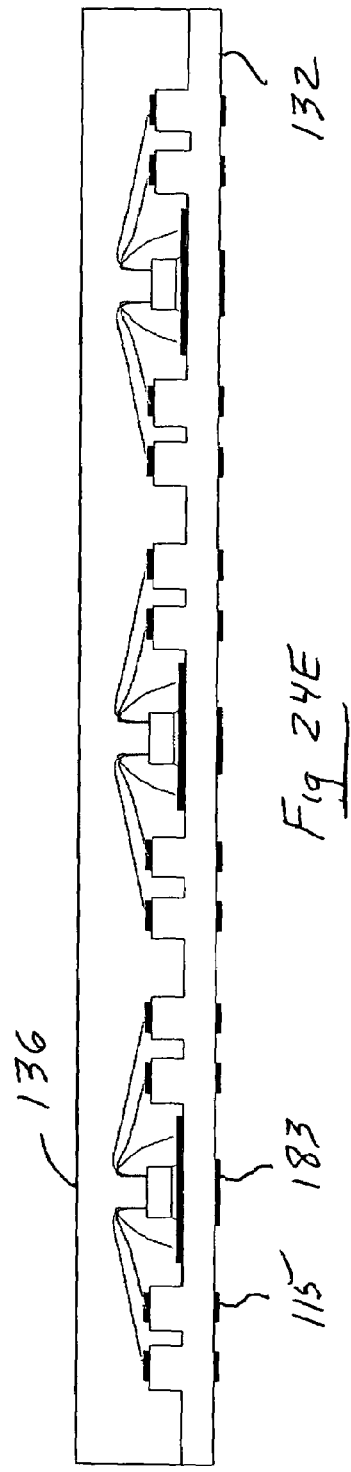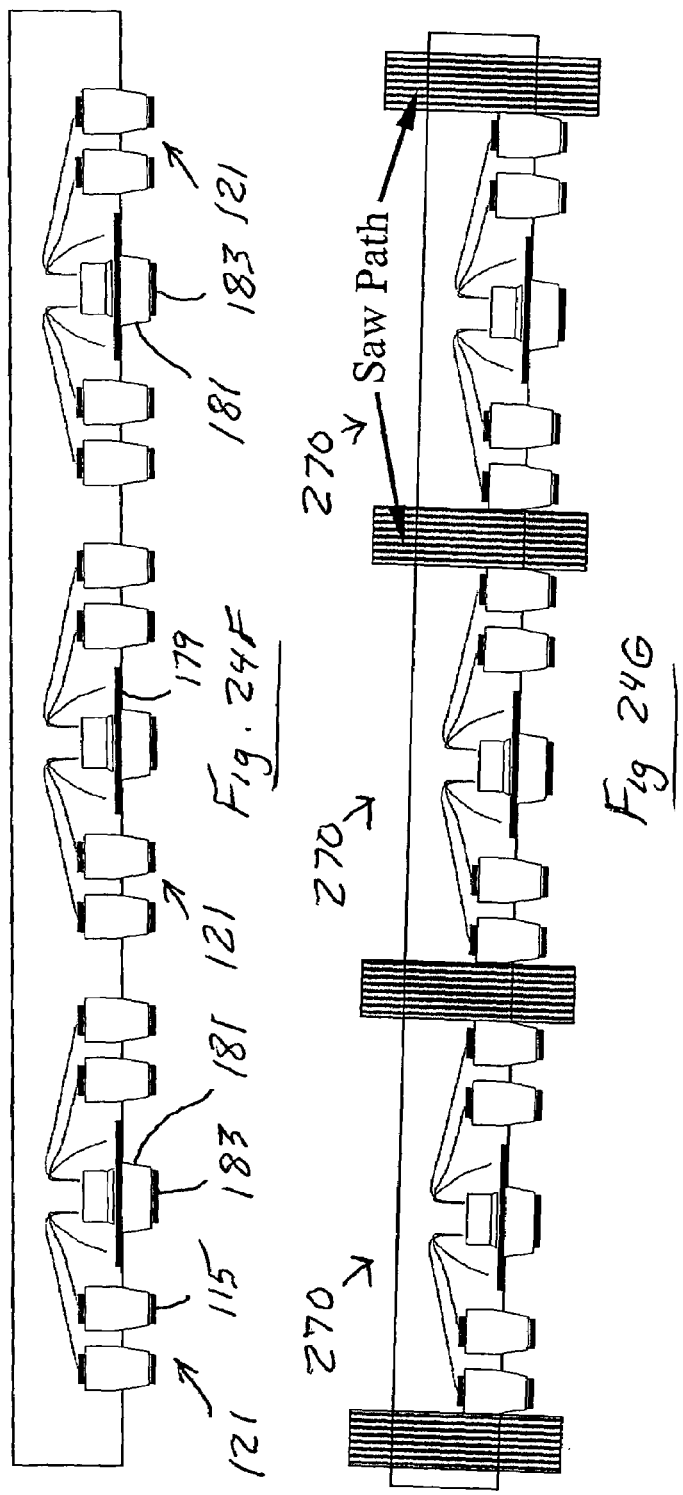

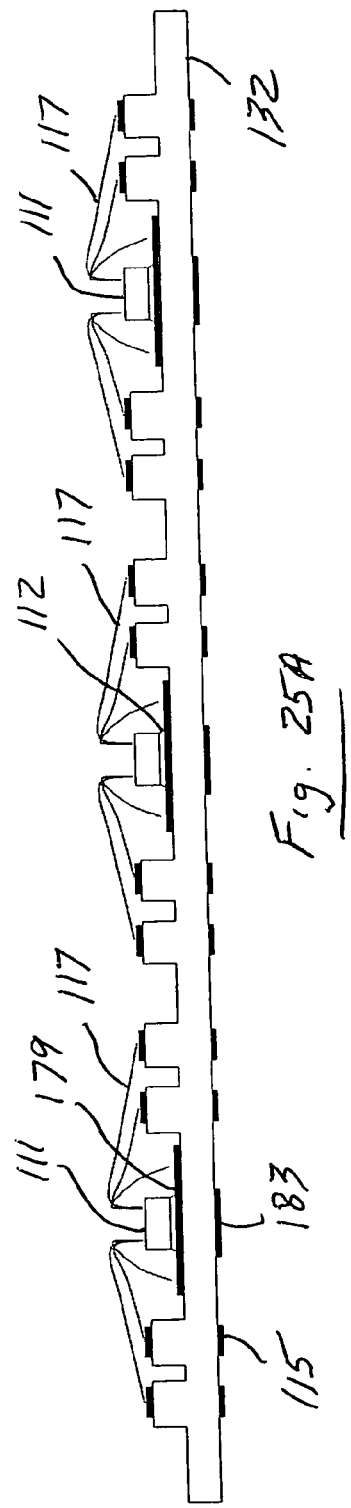
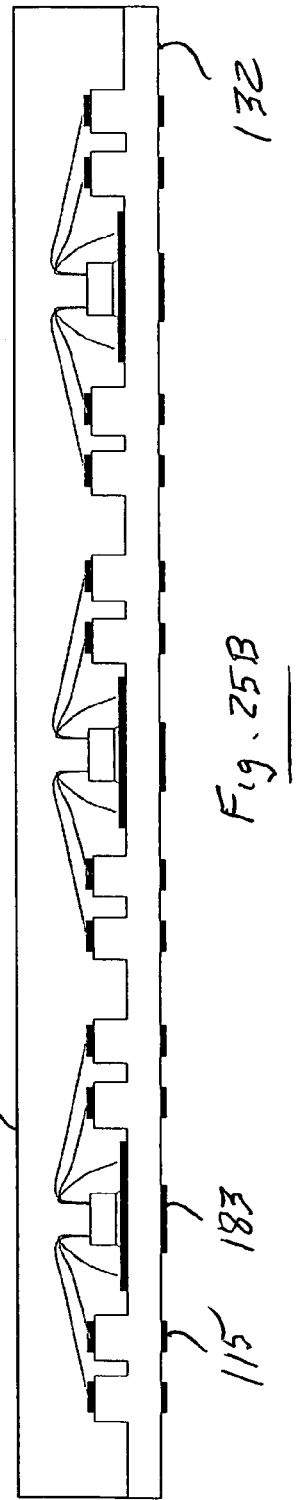
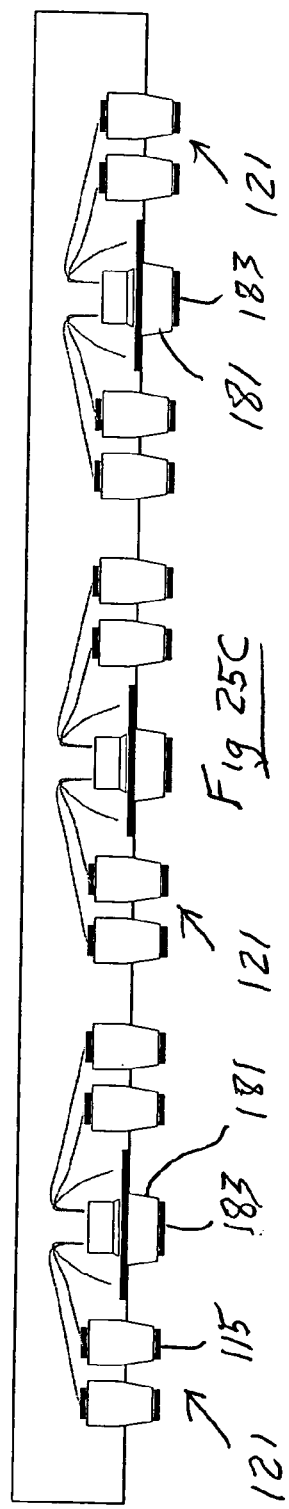
Fig. 25A
Fig. 25B
Fig. 25C

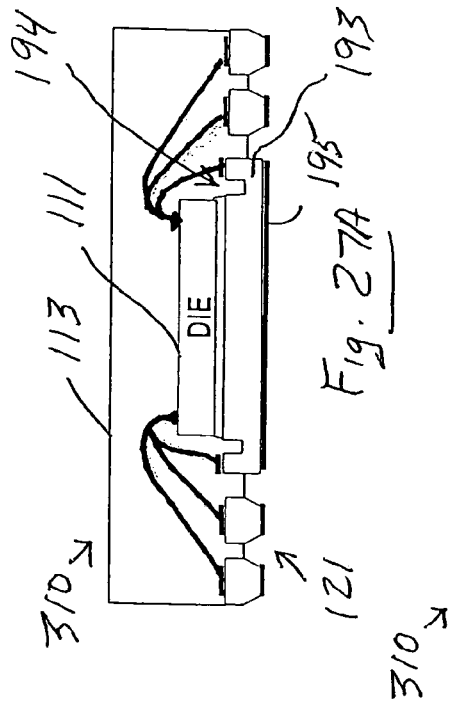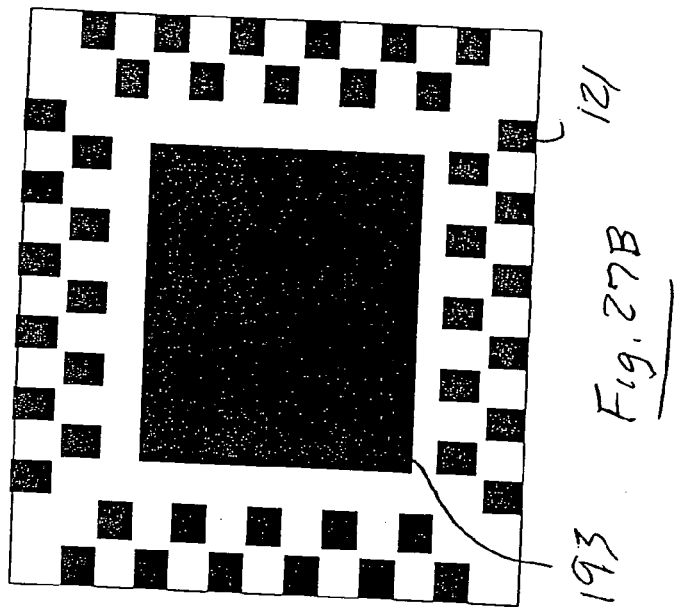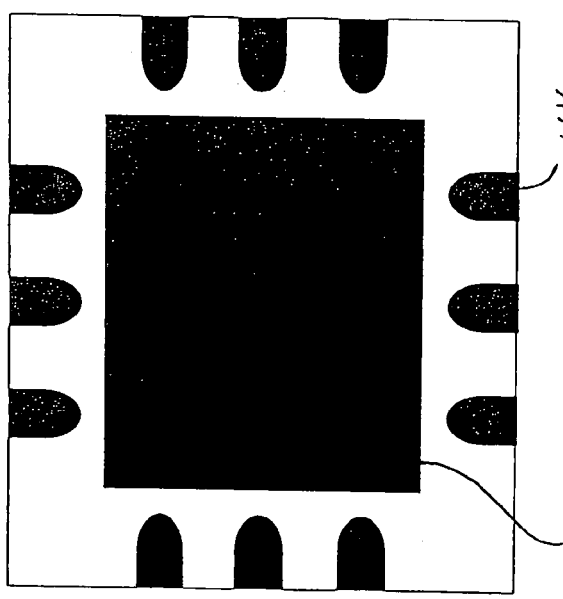

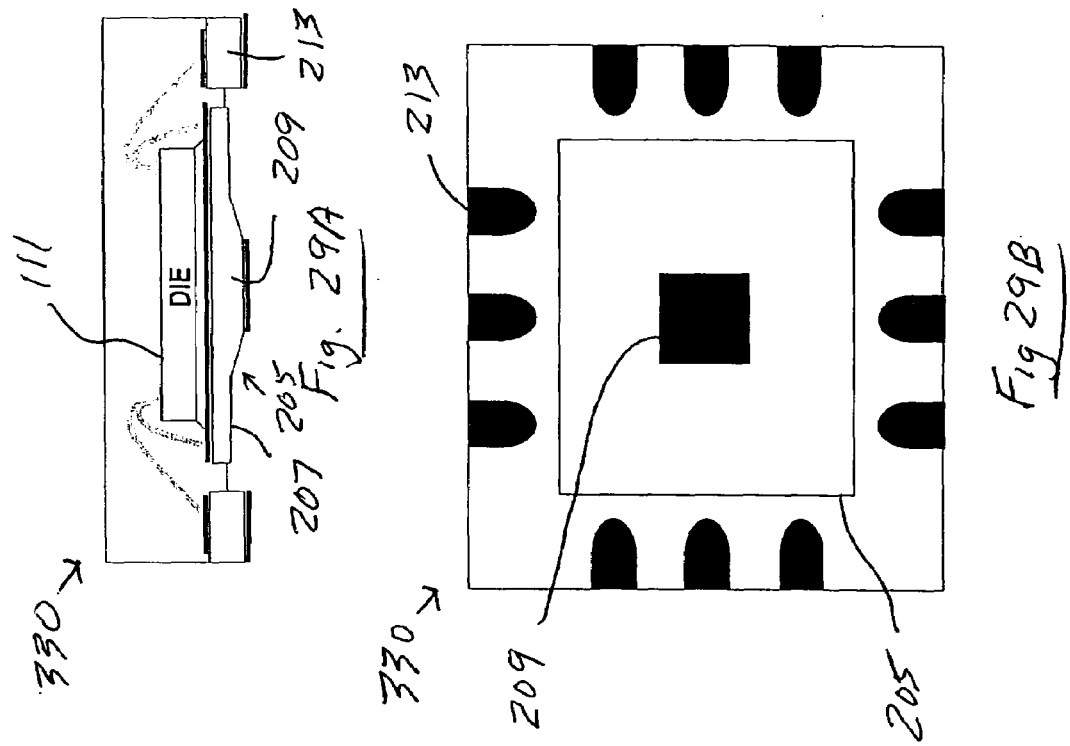
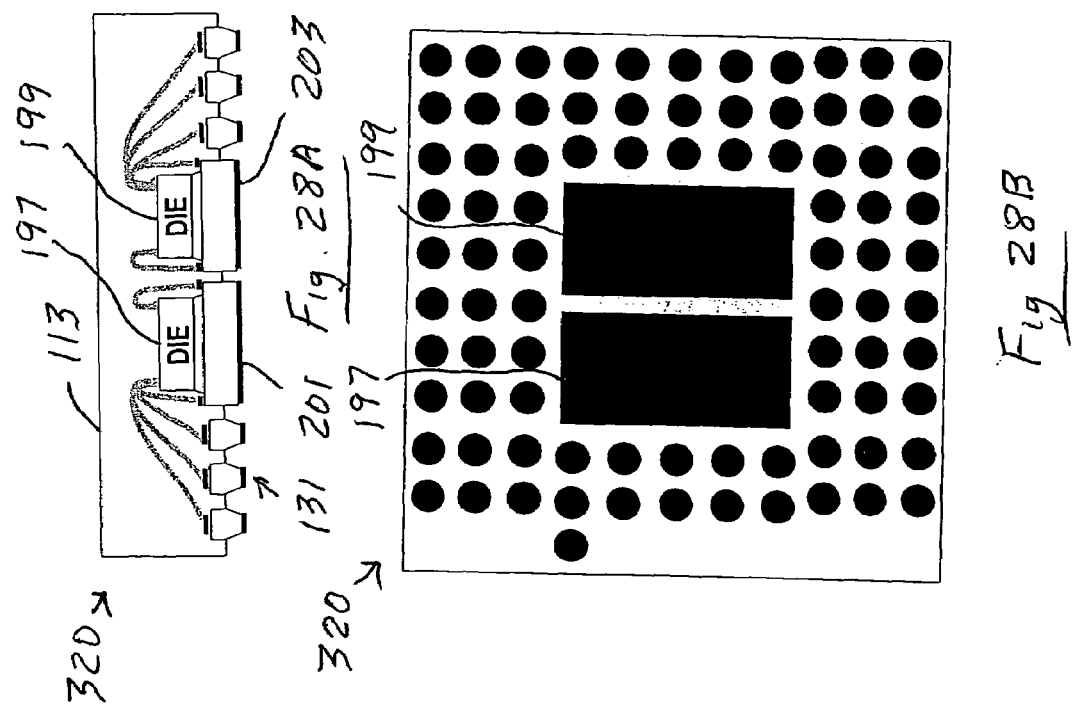

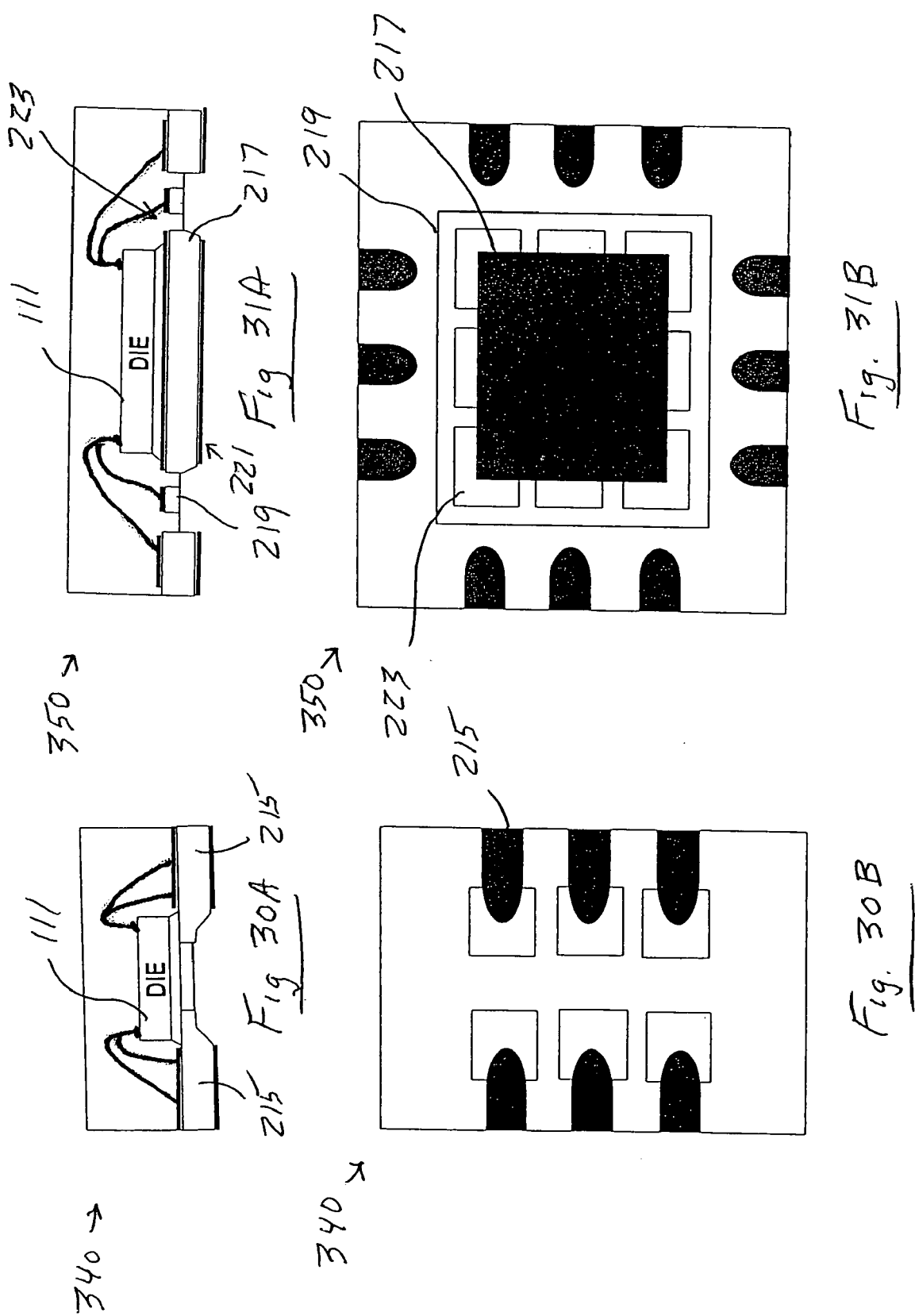

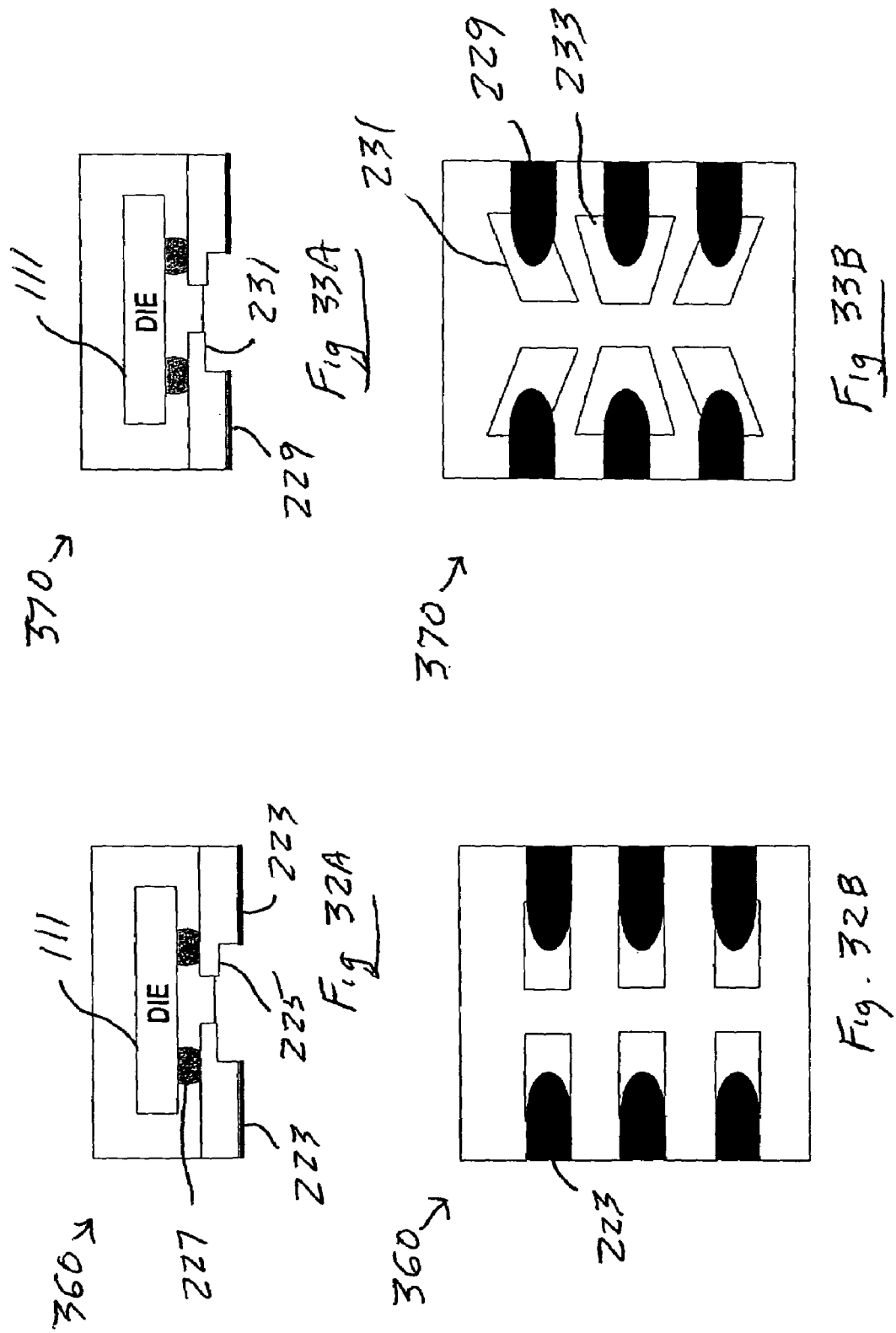

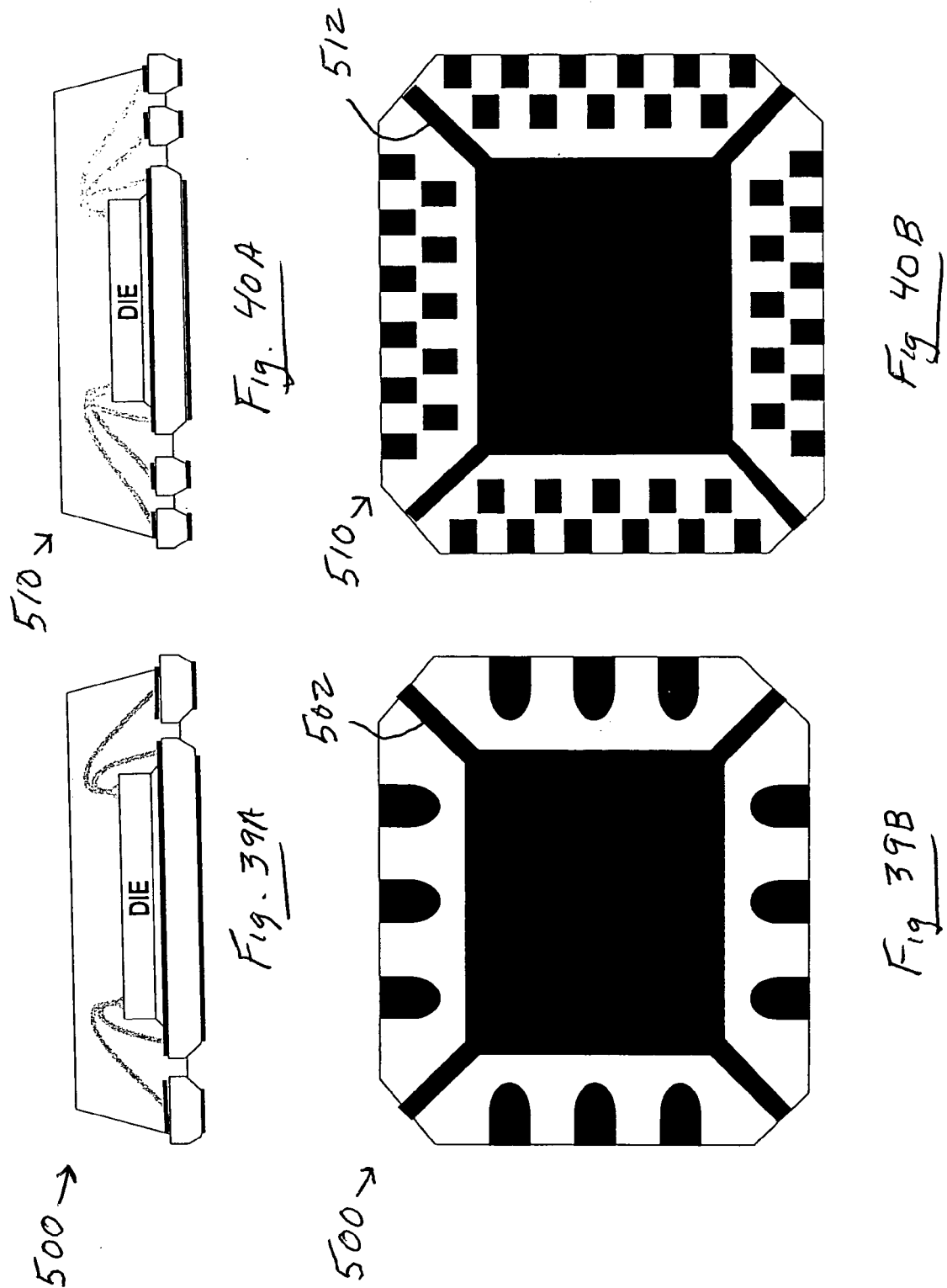

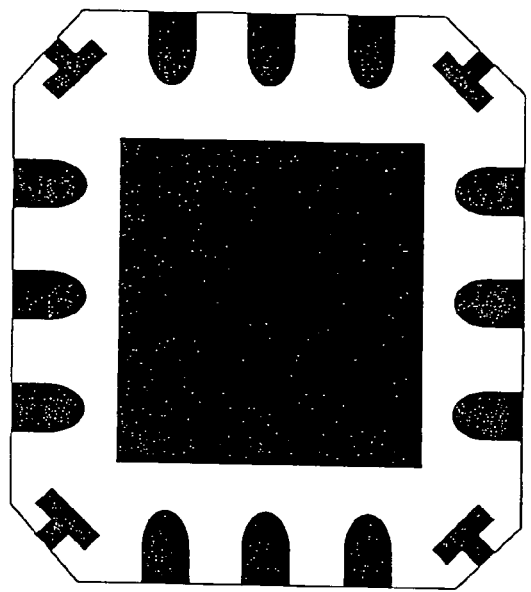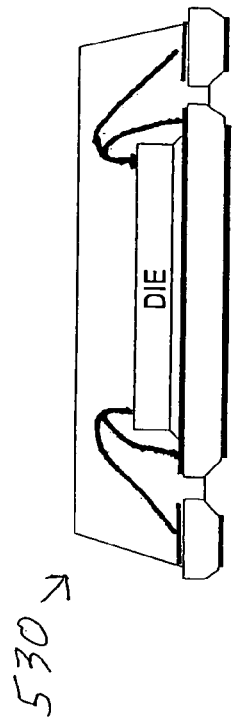
Fig. 42A
Fig. 42B
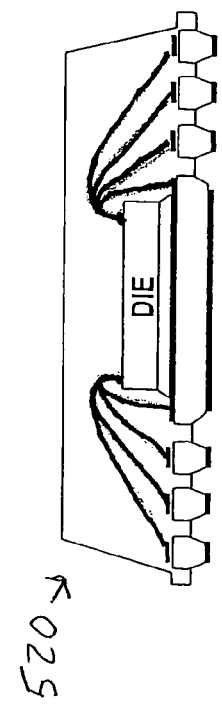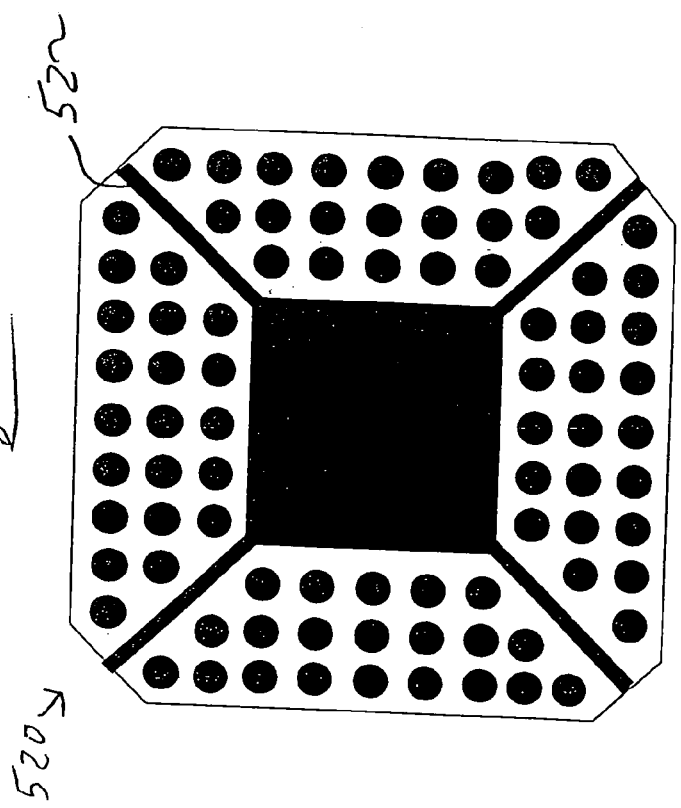
Fig. 41A
Fig. 41B

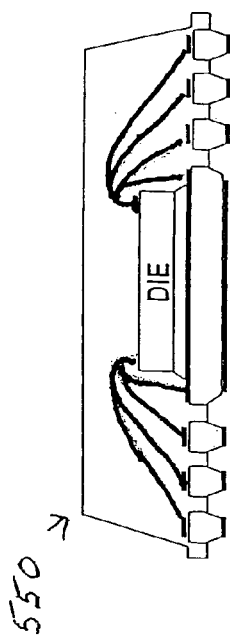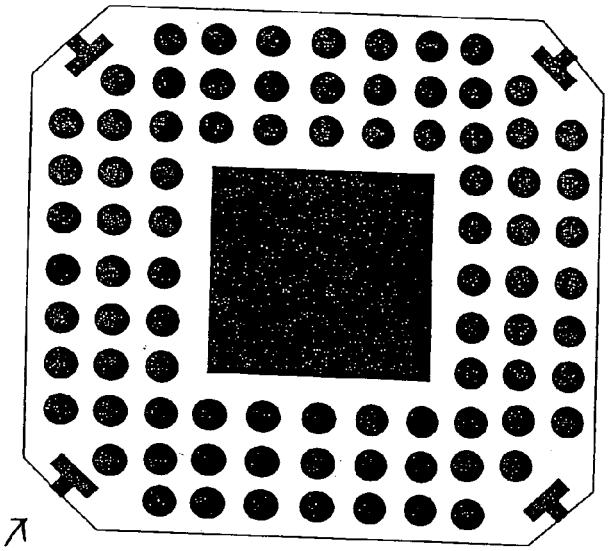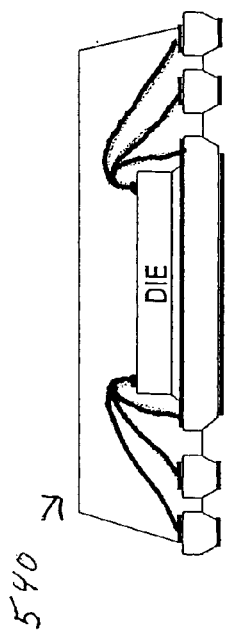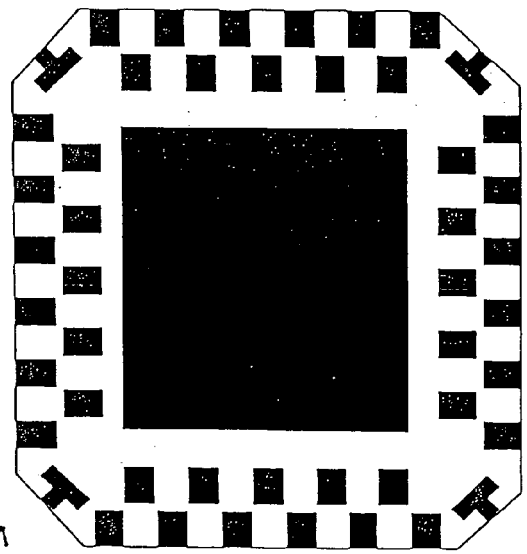

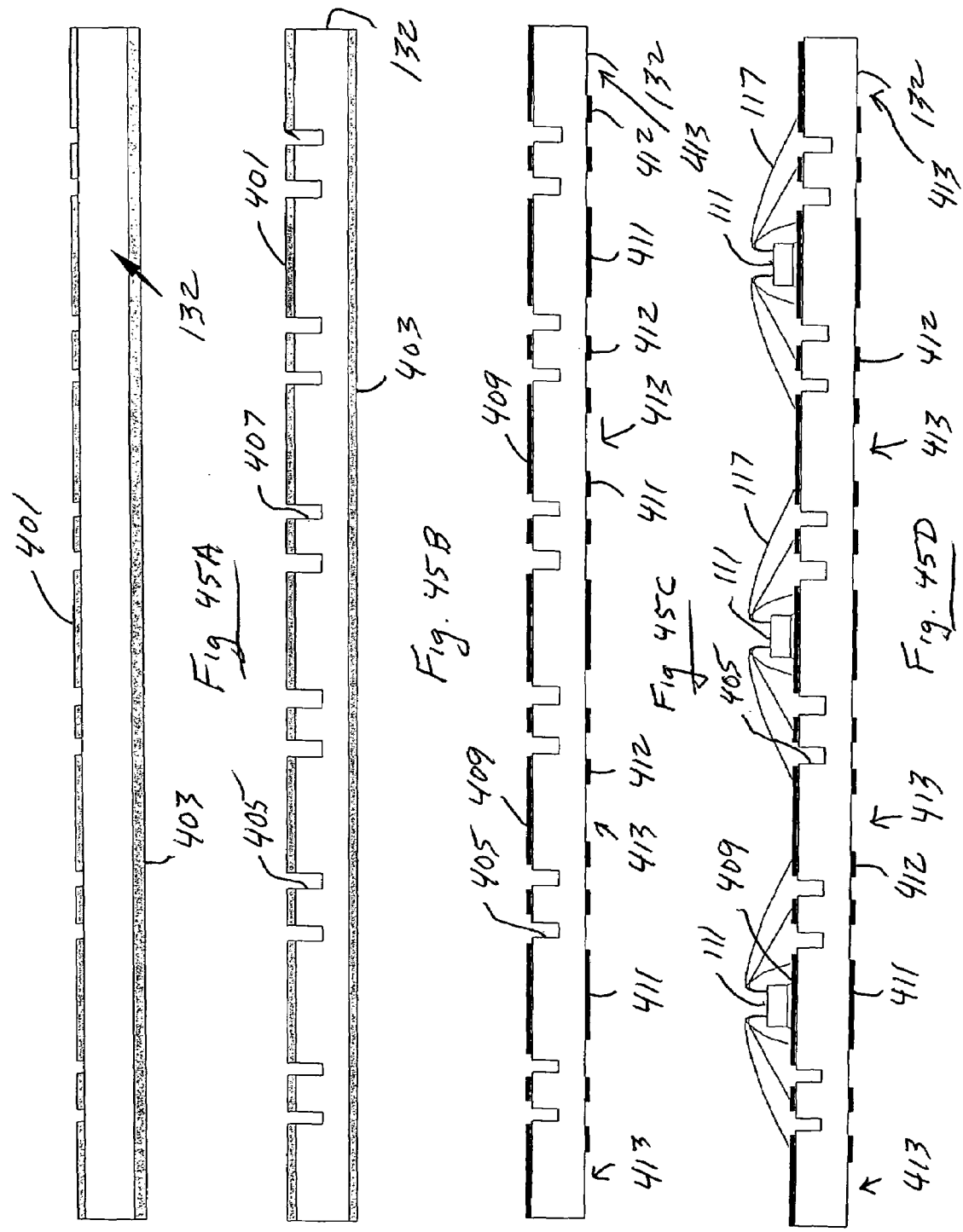

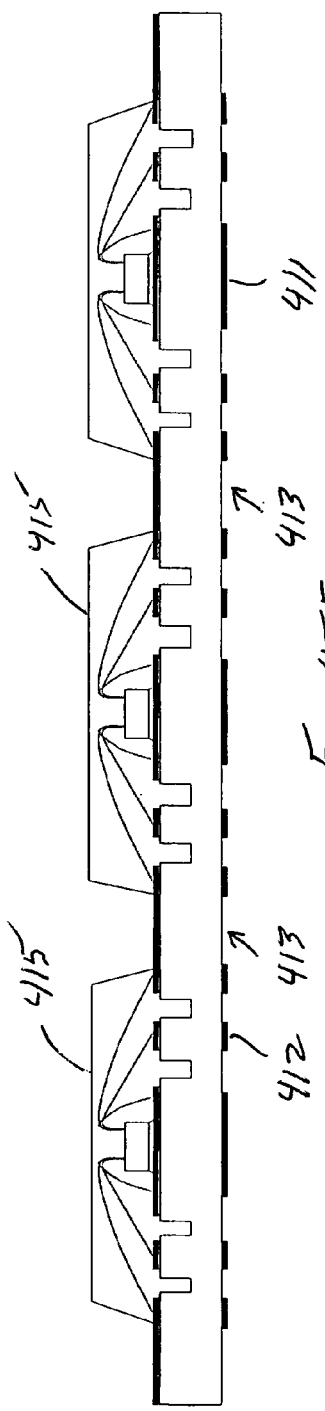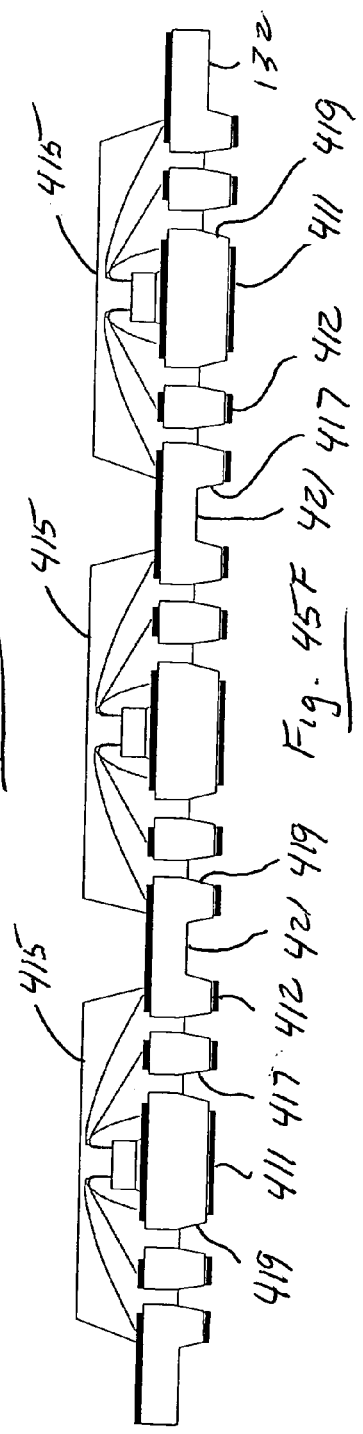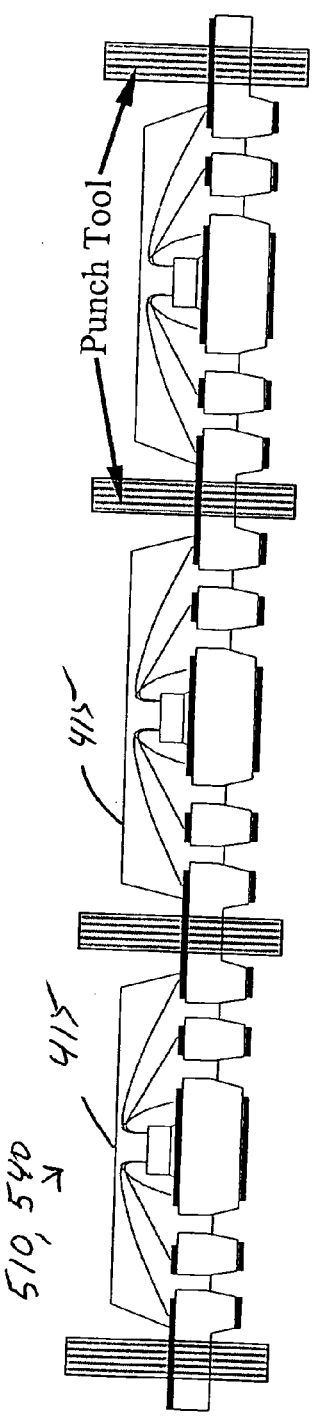

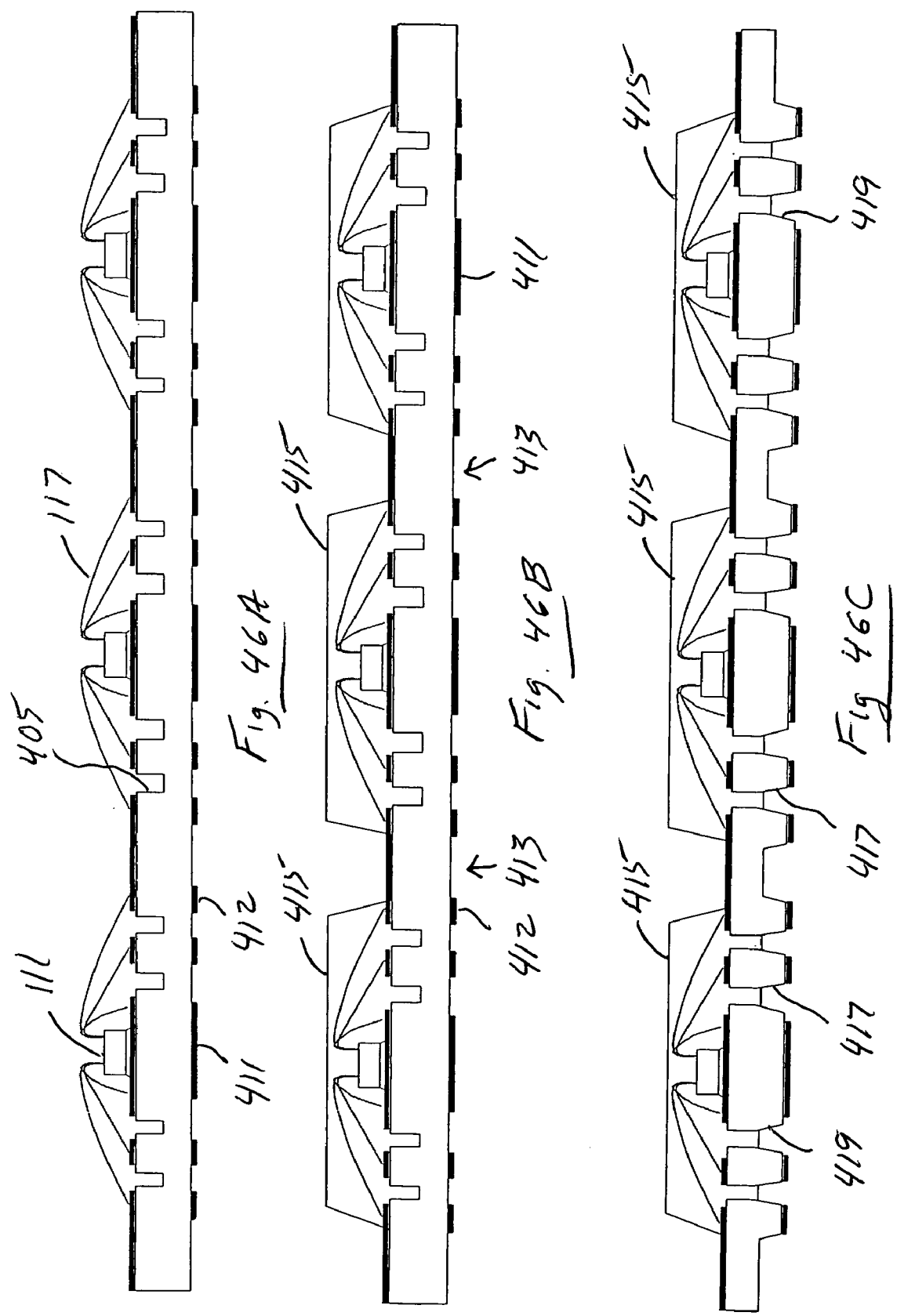

FLAT NO-LEAD SEMICONDUCTOR DIE PACKAGE INCLUDING STUD TERMINALS

FIELD OF THE INVENTION

This invention relates to packages for semiconductor dice and in particular to "no-lead" packages, i.e., packages in which there are no leads protruding from the surfaces of the package. Instead, electrical contact to external circuitry is made by means of contacts having exposed faces that are flush with the surfaces of the package.

BACKGROUND OF THE INVENTION

Semiconductor dice are normally packaged in a plastic capsule to protect them from physical damage. Connections are made to external circuitry, such as a printed circuit board (PCB), by means of sheet metal pieces, called "lead fingers," that protrude from the capsule and can be soldered or otherwise connected electrically. Alternatively, in a "no lead" package the external connections are made in other ways, e.g., by means of contacts having faces that are flush with the surfaces of the capsule. Two types of "no-lead" packages are designated in the industry as QFN (Quad Flat No Lead) and DFN (Dual Flat No Lead).

A cross-sectional view of a typical "no-lead" package 10 is illustrated in FIG. 1A. A bottom view of the package is shown in FIG. 1B. Package 10 contains a semiconductor die 12, a die-attach pad 14, bonding wires 16 and contacts 18, through which die 12 may be contacted electrically. Die 12 is bonded to die-attach pad 14 with an adhesive layer 20, which may be epoxy. These components are encased in a capsule 22 which is made of a plastic molding compound. Package 10 may be mounted on a PCB, with the bottom surfaces of contacts 18 soldered, for example, to metal pads or traces on the PCB.

"No-lead" packages are normally manufactured by attaching a plurality of dice to corresponding die-attach pads in a leadframe. The dice and die-attach pads are then encased in a plastic molding compound, and the dice are separated by sawing to produce individual packages each containing a single die.

In practice, the packages must satisfy a wide variety of constraints and requirements that are not met by the basic package shown in FIGS. 1A and 1B. For example, in some situations the designer of the equipment in which the package will be used wishes to have exposed traces on a PCB underneath the package, in which case the die-attach pad of the kind shown in FIGS. 1A and 1B would create short-circuits between the traces. In other cases the equipment designer wishes to include several dice or a single large die within the package, in which case a package of the kind shown in FIGS. 1A and 1B might be too thick. In some cases, it is desired to have a die-attach pad exposed on one principal surface of the package and contacts exposed on the opposite principal surface of the package. Another problem that can occur is short-circuiting resulting from solder bridging between the terminals or between a terminal and an exposed pad.

SUMMARY OF THE INVENTION

A semiconductor die package according to this invention includes a semiconductor die, a capsule enclosing said die, a plurality of metal studs and a plurality of bonding wires. Each of the bonding wires extends between a first bonding location on the die and a second bonding location adjacent an upper surface of one of said metal studs. Each of the metal studs protrudes from a bottom surface of the capsule and has a flat bottom surface. In some embodiments the studs comprise a first metal and a layer of a second metal is formed on said flat bottom surfaces of the studs. The first metal can be a copper alloy and the second metal may comprise nickel (e.g., Ni/Pd/Au).

Embodiments of this the invention can take a wide variety of forms. In some embodiments, the package is rectangular and a single row of studs are positioned on two or four sides of the package. In some embodiments two or more rows of studs can be arrayed around the die.

An epoxy layer underlying the die may be exposed on the bottom of the package, the exposed surface of the epoxy layer being substantially coplanar with the bottom surface of the capsule. In other embodiments, a plated layer of metal is exposed on the bottom of the package. In still other embodiments, the die is attached to a die-attach pad, which is exposed on the bottom of the package. Bonding wires may extend from the die to the die-attach pad. The die-attach pad can protrude from the bottom surface of the capsule such that a bottom surface of the die-attach pad is substantially coplanar with the bottom surfaces of the studs. In some embodiments the die-attach pad has the same thickness as the studs. In other embodiments the die-attach pad is thinner than the studs, and the lateral dimensions of die-attach pad can be larger or smaller than the lateral dimensions of the die.

In some embodiments the top surface of the die-attach pad may be shaped in various ways, for example, with a cavity for holding the die or with a moat surrounding the die. Embodiments according to the invention may contain more than one die.

In some embodiments the die is mounted directly to the studs, either in a conventional manner using epoxy or in a "flip-chip" manner using solder balls, gold or nickel-gold bumps or copper pillar bumps.

This invention also includes a method of fabricating a semiconductor die package. The method includes forming a first mask layer having a first pattern on a first surface of a metal sheet, etching partially through the thickness of the metal sheet through openings in the first mask layer, attaching semiconductor dice at locations on the etched side of the sheet, applying a layer of a molding compound over the etched side of the sheet, forming a second mask layer having a second pattern on a second surface of a metal sheet, and etching partially through the thickness of the metal sheet through openings in the second mask layer. A variety of embodiments can be created by altering the first and second patterns of the first and second mask layers, respectively.

BRIEF DESCRIPTION OF THE DRAWINGS

The invention will be best understood by referring to the following drawings, in which like reference numerals refer to similar components unless otherwise stated.

FIGS. 1A and 1B illustrate cross-sectional and bottom views, respectively, of a conventional no-lead package.

FIGS. 2A–2B, 3A–3B and 4A–4B illustrate packages in accordance with this invention in which an epoxy layer is exposed on the bottom of the package.

FIGS. 5A–5G illustrate a process for fabricating the package shown in FIGS. 3A–3B.

FIGS. 6A–6B, 7A–7B and 8A–8B illustrate packages in accordance with this invention in which a plated metal layer is exposed on the bottom of the package.

FIGS. 9A–9G illustrate a process for fabricating the package shown in FIGS. 7A–7B.

FIGS. 10A–10E illustrate a process for fabricating the package shown in FIGS. 7A–7B which includes an extra plated metal layer on the die-attach pad and studs.

FIGS. 11A–11B, 12A–12B and 13A–13B illustrate packages in accordance with this invention which contain a die-attach pad that is of approximately the same thickness as the studs.

FIGS. 14A–14G illustrate a process for fabricating the package shown in FIGS. 12A–12B.

FIGS. 15A–15E illustrate a process for fabricating the package shown in FIGS. 12A–12B which includes an extra plated metal layer on the die-attach pad and studs.

FIGS. 16A–16B, 17A–17B and 18A–18B illustrate packages in accordance with this invention which contain a die-attach pad that is of approximately one-half the thickness of the studs.

FIGS. 19A–19G illustrate a process for fabricating the package shown in FIGS. 17A–17B.

FIGS. 20A–20E illustrate a process for fabricating the package shown in FIGS. 17A–17B which includes an extra plated metal layer on the die-attach pad and studs.

FIGS. 21A–21B, 22A–22B and 23A–23B illustrate packages in accordance with this invention which contain a die-attach pad that is of approximately one-half the thickness of the studs and laterally smaller than the die.

FIGS. 24A–24G illustrate a process for fabricating the package shown in FIGS. 22A–22B.

FIGS. 26A–26B illustrate a package in accordance with this invention which contains a die-attach pad having a cavity for holding the die.

FIGS. 27A–27B illustrate a package in accordance with this invention which contains a die-attach pad having a moat surrounding the die.

FIGS. 28A–28B illustrate a package in accordance with this invention which contains a pair of dice.

FIGS. 29A–29B illustrate a package in accordance with this invention which contains a die-attach pad having a thick portion and a thin portion.

FIGS. 30A–30B illustrate a package in accordance with this invention in which the die is mounted on the studs.

FIGS. 31A–31B illustrate a package in accordance with this invention which contains a slotted die-attach pad.

FIGS. 32A–32B illustrate a dual package in accordance with this invention which contains a die mounted "flip chip" style on the studs.

FIGS. 33A–33B illustrate an alternative version of a dual package in accordance with this invention which contains a die mounted "flip chip" style on the studs.

FIGS. 39A–39B, 40A–40B, 41A–41B, 42A–42B, 43A–43B and 44A–44B illustrate packages in accordance with this invention that are separated from each other with a punch tool.

FIGS. 45A–45G illustrate a process for fabricating the package shown in FIGS. 40A–40B and 43A–43B using a punch tool.

FIGS. 46A–46E illustrate a process for fabricating the package shown in FIGS. 40A–40B and 43A–43B which includes an extra plated metal layer on the die-attach pad and studs.

DESCRIPTION OF THE INVENTION

Figure 15E:
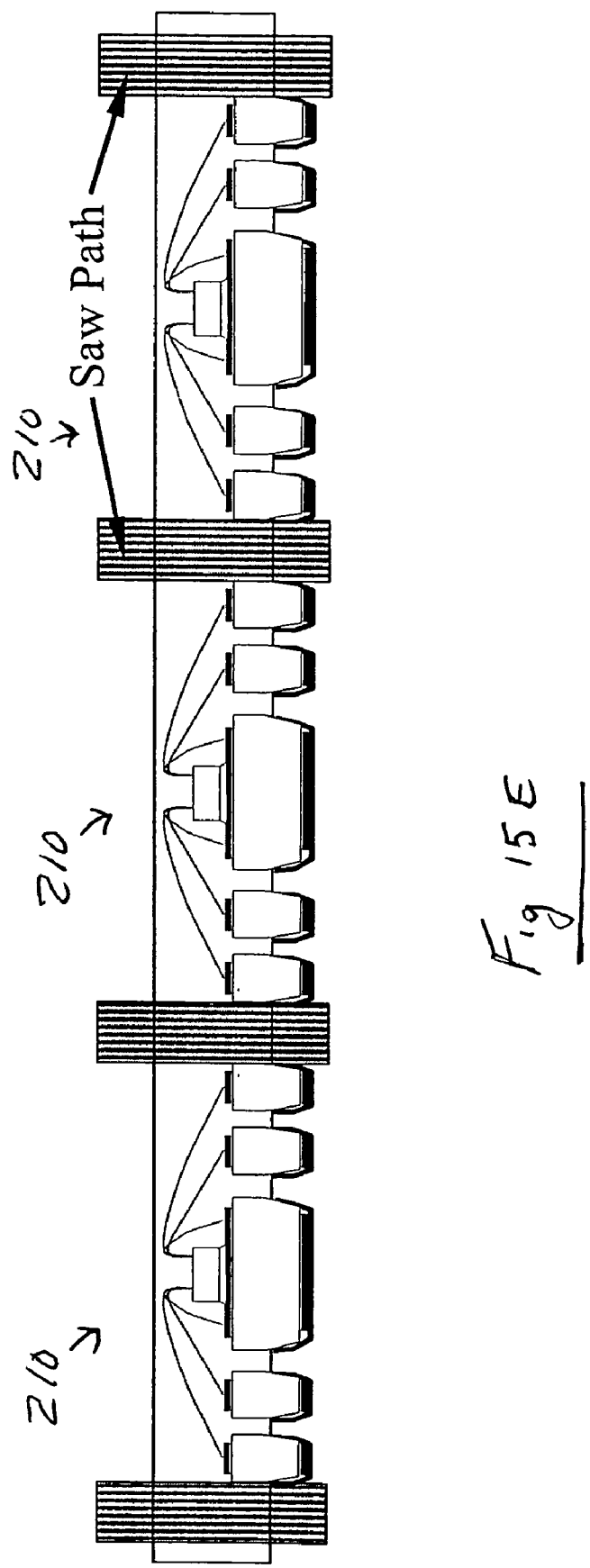

To illustrate the breadth of this invention, a variety of packages and processes for fabricating the packages will be described.

FIGS. 2A, 3A and 4A are cross-sectional views of packages 110, 120 and 130, respectively. Bottom views of packages 110, 120 and 130 are shown in FIGS. 2B, 3B and 4B, respectively.

Referring first to FIGS. 2A and 2B, package 110 includes a semiconductor die 111, which is enclosed in a capsule 113. Capsule 113 is normally made of a plastic molding compound. The molding compound may be a polymer or other epoxy material such as the Sumitomo G600 series, G770 series, EME 7730 series or the Hitachi CEL 9200 series, CEL 9220, CEL 9840 series, etc. Underlying die 111 is an exposed layer of epoxy 112, which is substantially coplanar with the bottom surface 118 of capsule 113. As shown in FIG. 2B, a plurality of metal studs 114 are positioned along the lateral edges of package 110. Referring again to FIG. 2A, studs 114 protrude from the bottom surface 118 of capsule 113, and bonding wires 117 extend between locations on die 111 to and locations on the upper surfaces of metal studs 114.

Metal studs 114 can be made of a copper alloy such as C194 (a composition of 97.5Cu 2.35Fe 0.03P 0.12Zn), C7025 (a composition of 96.2Cu 3.0Ni 0.65Si 0.15Mg), C151 (a composition are 99.9Cu 0.1Zr), or Eftec64T (a composition of 99.25Cu 0.3Cr 0.25Sn 0.2Zn).

Each of studs 114 has a flat bottom surface on which a first metal layer 115 is plated. A second metal layer 116 is plated on the top surfaces of studs 114. Metal layers 115 and 116 can be made of Ni/Pd/Au, for example.

Package 110 is thus a compact, durable package that can be mounted on a flat surface such as a PCB, with the bottom plated surfaces of studs in electric contact with corresponding electrical contacts or traces on the PCB. Except for the areas where metal studs 114 are present, the entire surface of the PCB under package 110 is available for other circuitry and will not be affected by the presence of package 110.

Packages 120 and 130 are similar to package 110, except that package 120 contains two rows of metal studs 121 surrounding die 111, and package 130 contains an array of three rows of metal studs 131 around die 111. As shown, the horizontal cross section of studs 121 is square, and the horizontal cross section of studs 131 is circular. Like studs 114, studs 121 and 131 have flat bottom surfaces.

FIGS. 5A–5G are cross-sectional views illustrating a process for fabricating packages similar to package 120, shown in FIGS. 3A and 3B. The process begins with a copper sheet 132. Sheet can be 0.127 mm, 0.203 mm, or 0.254 mm thick and may consist of the following copper alloys: C194 (a composition of 97.5Cu 2.35Fe 0.03P 0.12Zn), C7025 (a composition of 96.2Cu 3.0Ni 0.65 Si 0.15Mg), C151 (a composition of 99.9Cu 0.1Zr), Eftec64T (a composition of 99.25Cu 0.3Cr 0.25Sn 0.2Zn).

As shown in FIG. 5A, photoresist layers 133 and 134 are formed on the top and bottom surfaces, respectively, of sheet 132, and photoresist layer 133 is patterned as shown using a normal photolithographic process.

As shown in FIG. 5B, sheet 132 is half-etched through the openings in photoresist layer 133 to form pillars 135, which will become the upper portions of the metal studs. Photoresist layers 133 and 134 are then removed. Sheet 132 can be etched, for example, with a cupric chloride etchant at a temperature of 550° C. (±10° C.) for 19–20 seconds. The etching time typically varies with the length of the leadframe. With a leadframe 54.0 mm wide and 228.0 mm long and a conveyor speed of 11.67 mm/sec the time is about 19.5 seconds. Cupric chloride etchants are available from many suppliers, including ATOTECH, Meltex, Shipley Ronal, Electrochemical, Technic and MacDermid. Suitable etching tools are available from ATOTECH, MECO, and Technic.

As shown in FIG. 5C, metal layers 116 are plated on the top surfaces of pillars 135, and metal layers 115 are plated on the bottom surface of copper sheet 132 directly underneath pillars 135. An electroplating process may be used. Metal layers 115 and 116 can be fabricated by depositing a layer of photoresist (not shown) and patterning the photoresist layer to form openings where metal is to be electroplated. Layers of Ni, Pd and Au can be plated in succession, with the Ni layer being 10–80 micro inches thick, the Pd layer being 0.2–6.0 micro inches thick, and the Au layer being 30 Å or more thick. Electroplating tools are available from MECO, and TECHNIC.

Alternatively, the process steps shown in FIGS. 5B and 5C can be reversed. Under the alternative, the metal layers 115 and 116 are initially formed, as shown in FIG. 5C, by depositing a photoresist layer (not shown) and patterning the photoresist layer with openings where the metal is to be electroplated. After the metal layer has been formed, the photoresist layer is removed. Photoresist layer 133 is then deposited and photolithographically patterned with openings where copper sheet is to be etched to form pillars 135, as shown in FIG. 5B.

As shown in FIG. 5D, dice 111 are attached to sheet 132 between the pillars 135 with an epoxy layer 112. Using a wire bonding machine, wire bonds are made between locations on the dice 111 and the plated areas on the top surfaces of pillars 135.

As shown in FIG. 5E, a layer 136 of a plastic molding compound is spread over the entire top surface of copper sheet 132, covering the pillars 135, the dice 111 and the bonding wires 117. The molding compound can be the G600, G770, CEL9220, or CEL9200 series. Transfer molding equipment is used. Layer 136 can be spread to a thickness of from 0.3 mm to 0.55 mm, for example, depending on the package thickness requirement. For example, a 0.8 mm thick package requires a layer 136 that is 0.55 mm thick. Layer 136 is cured by heating it in a curing oven to 175° C. (+5° C.) for 2–6 hours, depending on the type of compound.

As shown in FIG. 5F, copper sheet 132 is etched from the bottom, removing all portions of copper sheet 132 except for those covered by metal layers 115 and forming metal studs 121. As a result of the etching process the lateral edges of the portions of metal studs 121 that protrude below plastic layer 136 are beveled. An immersion type etching process is used. The etchant can be a mixture of ammonia, ammonium or ammonia and chlorine. The etching process can be performed at a temperature of 49° C. (+5° C.) for four minutes. The etchant will not attack the plated layer (Ni/Pd/Au or Ag), so that the plated layer acts as a mask, allowing the copper sheet 132 to be etched in a pattern which creates studs 121. Suitable etching equipment is available from ATOTECH, TECHNIC, and MECO.

Finally, as shown in FIG. 5G, a dicing saw is used to separate packages 120 in both directions. A dicing saw from Resinoid can be used. A composite 0.30 mm thick blade available from Disco or Microswiss can be used.

It will be understood that packages 110 and 130 can be fabricated by means of a similar process except that photoresist layer 133 (FIG. 5A) and plated layer 115 (FIG. 5C) are patterned differently such that metal studs 114 and 131 are formed when copper sheet 132 is etched.

FIGS. 6A, 7A and 8A are cross-sectional views of packages 140, 150 and 160, respectively. Bottom views of packages 140, 150 and 160 are shown in FIGS. 6B, 7B and 8B, respectively. Packages 140, 150 and 160 are similar to packages 110, 120 and 130 except that a metal plated layer 141 is exposed on the bottom surface of the capsule 113.

FIGS. 9A–9G illustrate a process for fabricating packages 150. The process is similar to the process described above for fabricating packages 120. However, in the step shown in FIG. 9C, plated layers 141 are formed between the pillars 135, and as shown in FIG. 9D, dice 111 are attached to layers 141 by means of epoxy layers 112. Finally, in the step shown in FIG. 9F, the bottom surface of copper sheet 132 is etched until plated layers 141 are exposed.

Packages 140 and 160 can be fabricated by means of a similar process except that photoresist layer 133 (FIG. 9A) and plated layer 115 (FIG. 9C) are patterned differently such that metal studs 114 and 131 are formed when copper sheet 132 is etched. Also, as shown in FIG. 9D, terminals in dice 111 can be wire-bonded to locations on plated layers 141.

FIGS. 10A–10E illustrate a variation of the above process whereby the studs and exposed plated layers are subjected to an additional plating process. FIGS. 10A–10C correspond to FIGS. 9D–9F and show the process through the exposure of plated layers 141 by etching from the bottom of copper sheet 132. Next, as shown in FIG. 10D, plated layers 143 are formed on the exposed surfaces of the metal studs 121, and plated layers 145 are formed on the exposed surfaces of plated layer 141. This embodiment can provide better solder joint reliability by forming a solder fillet on the sides of the studs. The plating covers all areas of the stud that protrude from mold body. The sides of the studs are covered with a plated layer that can form a solder fillet when mounting the package to a printed circuit board (PCB) with solder paste. A copper surface cannot be used to form a solder joint.

Finally packages 170, containing the additional plated layers 143 and 145 are separated by sawing, as shown in FIG. 10E.

FIGS. 11A, 12A and 13A are cross-sectional views of packages 180, 190 and 200, respectively. Bottom views of packages 180, 190 and 200 are shown in FIGS. 11B, 12B and 13B, respectively. In each of packages 180, 190 and 200, the die 111 is bonded to a die-attach pad 149 via an epoxy layer 112 and a plated layer 147. A plated layer 151 is also formed on the bottom surface of die-attach pad 149. The die-attach pad 149 has substantially the same thickness as the metal studs.

FIGS. 14A–14G are cross-sectional views illustrating a process for fabricating packages similar to package 190, shown in FIGS. 12A and 12B. The process begins with copper sheet 132. As shown in FIG. 14A, photoresist layers 155 and 157 are formed on the top and bottom surfaces, respectively, of sheet 132, and photoresist layer 155 is patterned as shown using a normal photolithographic process.

As shown in FIG. 14B, sheet 132 is half-etched through the openings in photoresist layer 155 to form pillars 135, which will become the upper portions of the metal studs, and mesas 159, which will become the upper portions of the die-attach pads. Photoresist layers 155 and 157 are then removed.

As shown in FIG. 14C, metal layers 116 are plated on the top surfaces of pillars 135, and metal layers 115 are plated on the bottom surface of copper sheet 132 directly underneath pillars 135. Similarly, metal layers 147 are plated on the top surfaces of mesas 159 and metal layers 151 are plated on the bottom of copper sheet 132 directly underneath mesas 159. Metal layers 147 and 151 are formed and patterned in the same manner as metal layers 115 and 116, as described above.

As shown in FIG. 14D, each of the dice 111 is attached to sheet 132 on top of a mesa 159 by epoxy layer 112, which adheres to the top surface of metal layer 147. Using a wire bonding machine, wire bonds 117 are made between locations on the dice 111 and the plated areas on the top surfaces of pillars 135 and mesas 159.

As shown in FIG. 14E, a layer 136 of a plastic molding compound is spread over the entire top surface of copper sheet 132, covering the pillars 135, the mesas 159, the dice 111 and the bonding wires 117.

As shown in FIG. 14F, copper sheet 132 is etched from the bottom, removing all portions of copper sheet 132 except for those covered by metal layers 115 and 151 and forming metal studs 121 and die-attach pads 149. As a result of the etching process the lateral edges of the portions of metal studs 121 and die-attach pads 149 that protrude below plastic layer 136 are beveled.

Finally, as shown in FIG. 14G, a dicing saw is used to separate packages 190 in both directions.

FIGS. 15A–15E illustrate a variation of the above process whereby the studs and exposed plated layers are subjected to an additional plating process. FIGS. 15A–15C correspond to FIGS. 14D–14F and show the process through the formation of metal studs 121 and die-attach pads 149. Next, as shown in FIG. 15D, plated layers 161 are formed on the exposed surfaces of the metal studs 121, and plated layers 163 are formed on the exposed surfaces of die-attach pads 149. Finally packages 210, containing the additional plated layers 161 and 163 are separated by sawing, as shown in FIG. 15E.

FIGS. 16A, 17A and 18A are cross-sectional views of packages 220, 230 and 240, respectively. Bottom views of packages 220, 230 and 240 are shown in FIGS. 16B, 17B and 18B, respectively. In each of packages 220, 230 and 240, the die 111 is bonded to a die-attach pad 165 via an epoxy layer 112 and a plated layer 167. The thickness of die-attach pad 165 is approximately one-half the thickness of metal studs 114, 121 and 131. A plated layer 169 is also formed on the bottom surface of die-attach pad 165.

FIGS. 19A–19G are cross-sectional views illustrating a process for fabricating packages similar to package 230, shown in FIGS. 17A and 17B. The process begins with copper sheet 132. As shown in FIG. 19A, photoresist layers 171 and 173 are formed on the top and bottom surfaces, respectively, of sheet 132, and photoresist layer 171 is patterned as shown using a normal photolithographic process.

As shown in FIG. 19B, sheet 132 is half-etched through the openings in photoresist layer 171 to form pillars 135, which will become the upper portions of the metal studs. Photoresist layers 171 and 173 are then removed.

As shown in FIG. 19C, metal layers 116 are plated on the top surfaces of pillars 135, and metal layers 115 are plated on the bottom surface of copper sheet 132 directly underneath pillars 135. Similarly, metal layers 167 are plated on the top surface of copper sheet 132 and metal layers 169 are plated on the bottom of copper sheet 132 in the areas between pillars 135. Metal layers 167 and 169 are formed and patterned in the same manner as metal layers 115 and 116, as described above.

As shown in FIG. 19D, each of the dice 111 is attached to sheet 132 on top of a metal layer 167 by epoxy layer 112, which adheres to the top surface of metal layer 167. Using a wire bonding machine, wire bonds 117 are made between locations on the dice 111 and the metal layers 116 and 167.

As shown in FIG. 19E, a layer 136 of a plastic molding compound is spread over the entire top surface of copper sheet 132, covering the pillars 135, the dice 111 and the bonding wires 117.

As shown in FIG. 19F, copper sheet 132 is etched from the bottom, removing all portions of copper sheet 132 except for those covered by metal layers 115 and 169 and forming metal studs 121 and die-attach pads 165. As a result of the etching process the lateral edges of the portions of metal studs 121 and die-attach pads 165 that protrude below plastic layer 136 are beveled. The relative sizes of metal layers 167 and 169 can be set such that die-attach pads cover metal layers 167.

Finally, as shown in FIG. 19G, a dicing saw is used to separate packages 230 in both directions.

Figure 20D:
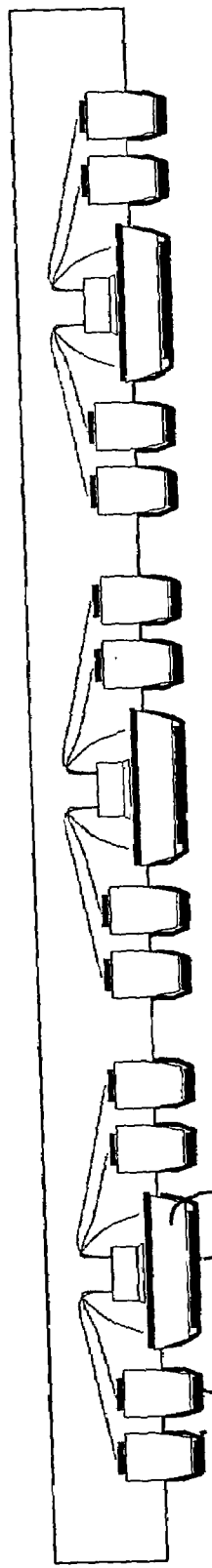
Figure 20E:
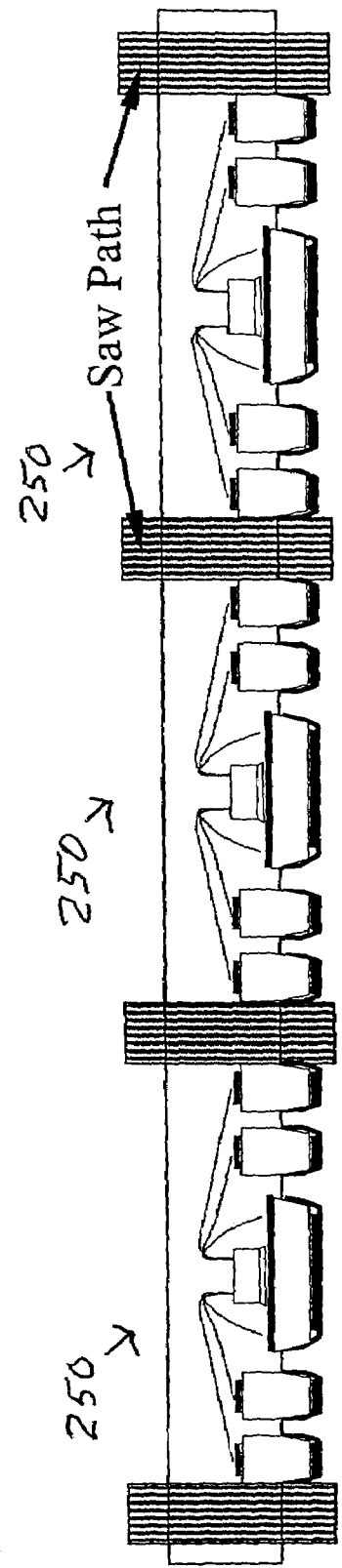

FIGS. 20A–20E illustrate a variation of the above process whereby the studs and exposed plated layers are subjected to an additional plating process. FIGS. 20A–20C correspond to FIGS. 19D–19F and show the process through the formation of metal studs 121 and die-attach pads 165. Next, as shown in FIG. 20D, plated layers 175 are formed on the exposed surfaces of the metal studs 121, and plated layers 177 are formed on the exposed surfaces of die-attach pads 165. Finally packages 250, containing the additional plated layers 175 and 177 are separated by sawing, as shown in FIG. 20E.

FIGS. 21A, 22A and 23A are cross-sectional views of packages 260, 270 and 280, respectively. Bottom views of packages 260, 270 and 280 are shown in FIGS. 21B, 22B and 23B, respectively. In each of packages 260, 270 and 280, the die 111 is bonded to a die-attach pad 181 via an epoxy layer 112 and a plated layer 179. Plated layer 179 extends laterally well beyond the perimeter of die-attach pad 181, and the thickness of die-attach pad 181 is approximately one-half the thickness of metal studs 114, 121 and 131. A plated layer 183 is also formed on the bottom surface of die-attach pad 181.

FIGS. 24A–24G are cross-sectional views illustrating a process for fabricating packages similar to package 270, shown in FIGS. 22A and 22B. The process begins with copper sheet 132. As shown in FIG. 24A, photoresist layers 171 and 173 are formed on the top and bottom surfaces, respectively, of sheet 132, and photoresist layer 171 is patterned as shown using a normal photolithographic process.

As shown in FIG. 24B, sheet 132 is half-etched through the openings in photoresist layer 171 to form pillars 135, which will become the upper portions of the metal studs. Photoresist layers 171 and 173 are then removed.

As shown in FIG. 24C, metal layers 116 are plated on the top surfaces of pillars 135, and metal layers 115 are plated on the bottom surface of copper sheet 132 directly underneath pillars 135. Similarly, metal layers 179 are plated on the top surface of copper sheet 132 and metal layers 183 are plated on the bottom of copper sheet 132 in the areas between pillars 135. Metal layers 183 have smaller lateral dimensions than metal layers 179, shown in FIG. 19C. Metal layers 179 and 183 are formed and patterned in the same manner as metal layers 115 and 116, as described above.

As shown in FIG. 24D, each of the dice 111 is attached to sheet 132 on top of a metal layer 179 by epoxy layer 112, which adheres to the top surface of metal layer 179. Using a wire bonding machine, wire bonds 117 are made between locations on the dice 111 and the metal layers 116 and 179.

As shown in FIG. 24E, a layer 136 of a plastic molding compound is spread over the entire top surface of copper sheet 132, covering the pillars 135, the dice 111 and the bonding wires 117.

As shown in FIG. 24F, copper sheet 132 is etched from the bottom, removing all portions of copper sheet 132 except for those covered by metal layers 115 and 183 and forming metal studs 121 and die-attach pads 181. Because metal layers 183 are considerably smaller than metal layers 179, a portion of the lower surfaces of metal layers 179 is exposed by the etching process. Further, as a result of the etching process the lateral edges of the portions of metal studs 121 and die-attach pads 181 that protrude below plastic layer 136 are beveled.

Finally, as shown in FIG. 24G, a dicing saw is used to separate packages 270 in both directions.

Figure 25P:
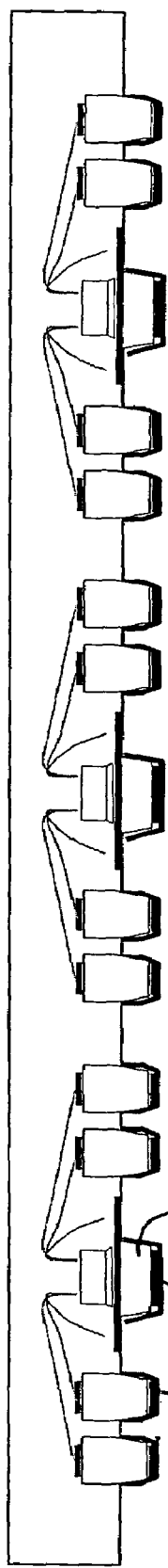
FIGS. 25A–25E illustrate a process for fabricating the package shown in FIGS. 22A–22B which includes an extra plated metal layer on the die-attach pad and studs.
Figure 25E:
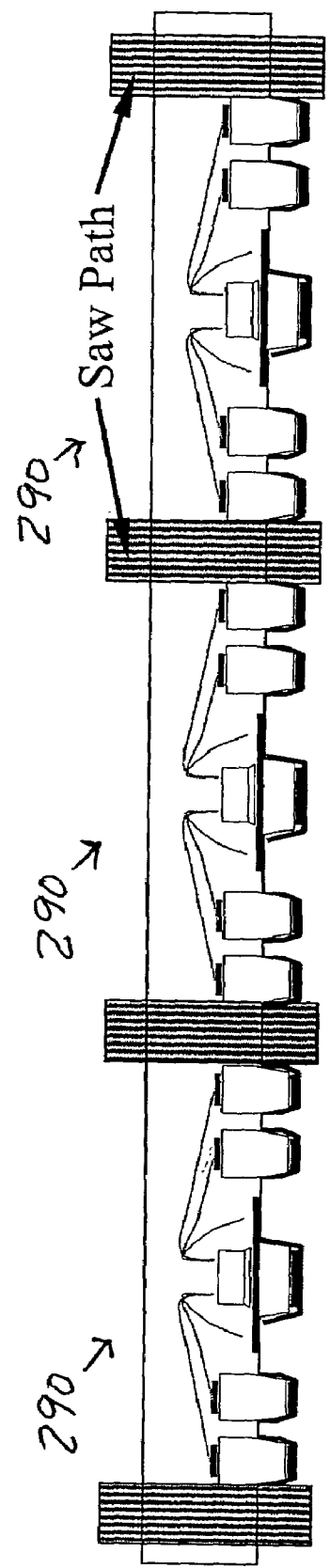
Figure 34A:
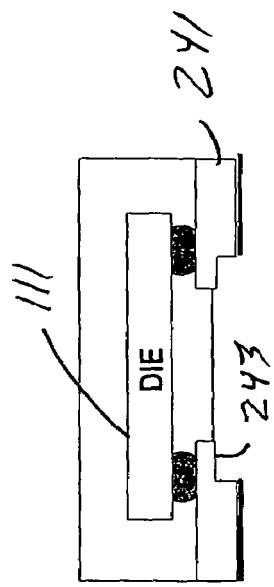
FIGS. 34A–34B illustrate a quad package in accordance with this invention which contains a die mounted "flip chip" style on a die-attach pad and on the studs.
Figure 35A:
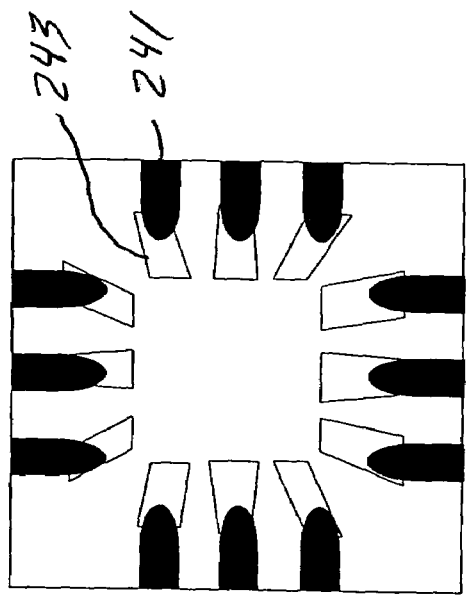
FIGS. 35A–35B illustrate a quad package in accordance with this invention which contains a die-attach pad mounted "flip chip" style on the studs.
Figure 34B:
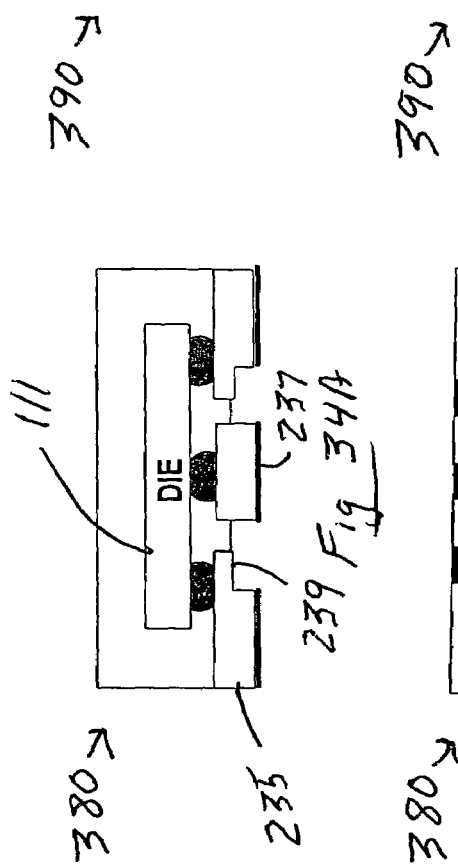
Figure 35B:
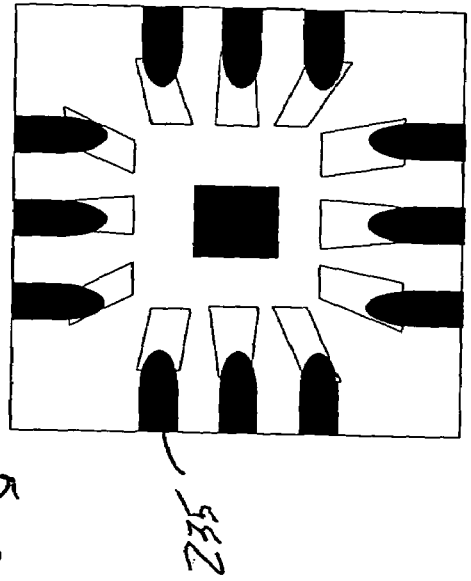

FIGS. 25A–25E illustrate a variation of the above process whereby the studs and exposed plated layers are subjected to an additional plating process. FIGS. 25A–25C correspond to FIGS. 24D–24F and show the process through the formation of metal studs 121 and die-attach pads 181. Next, as shown in FIG. 25D, plated layers 185 are formed on the exposed surfaces of the metal studs 121, and plated layers 187 are formed on the exposed surfaces of die-attach pads 181. Finally packages 290, containing the additional plated layers 185 and 187 are separated by sawing, as shown in FIG. 20E.

FIGS. 26A and 26B illustrate a package 300 in which semiconductor die 111 rests in a cavity 192 formed in a die-attach pad 189. Package 300 can be fabricated in a process similar to that described in FIGS. 14A–14G except that at the step illustrated in FIG. 14B photoresist layer 155 has an opening on the tops of mesas 159 so that cavity 192 is formed during the etch step illustrated in FIG. 14C. A plated layer 191 is formed on the bottom surface of die-attach pad 189.

FIGS. 27A and 27B illustrate a package 310 in which a die-attach pad 193 contains a moat 194 which surrounds semiconductor die 111. Package 310 can likewise be fabricated in a process similar to that described in FIGS. 14A–14G except that at the step illustrated in FIG. 14B photoresist layer 155 has an annular opening on the tops of mesas 159 so that moat 194 is formed during the etch step illustrated in FIG. 14C. A plated layer 195 is formed on the bottom surface of die-attach pad 193.

FIGS. 28A and 28B illustrate a package 320 which contains two semiconductor dice 197 and 199 supported by die-attach pads 201 and 203, respectively. Package 320 can likewise be fabricated in a process similar to that described in FIGS. 14A–14G except that at the step illustrated in FIG. 14B photoresist layer 155 has a longitudinal opening on the tops of mesas 159. Therefore, during the etch step illustrated in FIG. 14C mesas 159 are in effect split into two halves, and in the step illustrated in FIG. 14D dice 197 and 199 are bonded onto the tops of the two halves of mesas 159. Plated layer 151 has a similar longitudinal opening located directly below the longitudinal opening in photoresist layer 155. Therefore, during the etch step illustrated in FIG. 14E two die-attach pads 201 and 203 are formed.

A wide variety of packages can be made using the broad principles of this invention. In general, the variants are fabricated by altering the patterns of the mask layers that are formed on the two surfaces of the copper sheet, represented for example by photoresist layer 133 and plated metal layer 115 in FIGS. 5A and 5C. For example, FIGS. 29A and 29B show a package 330 in which a die 111 is attached to a die-attach pad 205 which contains a thin portion 207, a thick portion 209 and a graduated transition portion 211 between thin portion 207 and thick portion 209. Package 330 also includes studs 213.

In package 340, shown in FIGS. 30A and 30B, die 111 is attached by epoxy layer 112 to inner portions of the top surfaces of studs 215. Package 340 does not contain a die-attach pad.

In package 350, shown in FIGS. 31A and 31B, die 111 is attached to a slotted die-attach pad 221, which includes a thin outer portion 219 and a thick inner portion 217. Outer portion 219 and inner portion 217 are separated by a slot 223.

This invention can also be used to fabricate "flip-chip" packages, wherein the semiconductor die is inverted so that the contact pads are facing downward and the contact pads are electrically connected to the studs by solder balls. For example, in package 360, shown in FIGS. 32A and 32B, die 111 is inverted and attached to studs 223 by means of solder balls 227. Studs 223 include shelf portions 225 to which solder balls 227 are attached. Package 370, shown in FIG. 33B, is similar to package 360 except that shelf portions 231 are angled inward and shelf portions 233 are tapered. The solder balls can be in the form of copper pillar bumps or NiAu bumps.

Packages 360 and 370 are dual packages, meaning that studs 223 and 229 are arrayed along two opposite sides of the package. Packages 380 and 390, shown in FIGS. 34A–34B and 35A–35B, respectively, are quad packages, in which studs 235 and 241 are arrayed along the four sides of the package. Package 380 contains a die-attach pad 237, which is attached to die 111 by means of solder balls. Package 390 contains no die-attach pad. Studs 235 contain shelf portions 239 and studs 241 contain shelf portions 243. The solder balls can be in the form of copper pillar bumps or NiAu bumps.

Figure 36E:
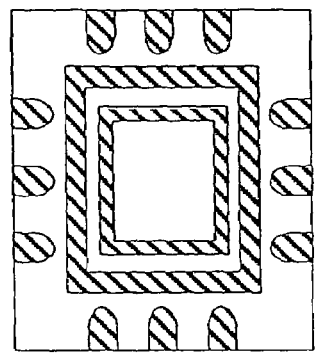
FIGS. 36E–36F illustrate a top view of the die-attach pad and studs and a cross-sectional view, respectively, of the third package.
Figure 36F:
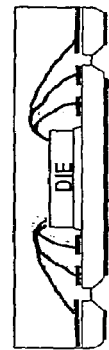
Figure 36:
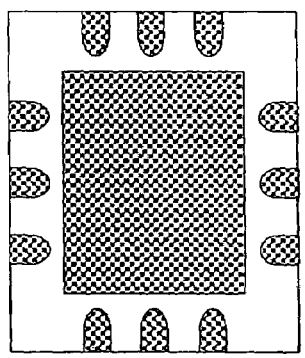
FIGS. 36, 37 and 38 illustrate bottom views of ten quad packages shown in FIGS. 36A–36F, 37A–37F and 38A–38H, respectively.
Figure 36C:
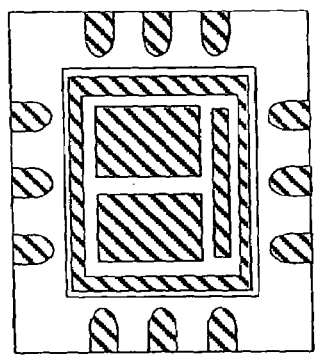
FIGS. 36C–36D illustrate a top view of the die-attach pad and studs and a cross-sectional view, respectively, of the second package.
Figure 36D:
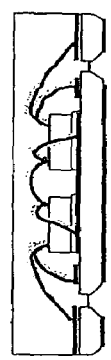

The plating layers inside the package can be designed to have special patterns to serve with many applications while the external package retains the same footprint. For example, FIGS. 36, 37 and 38 are bottom views of ten different packages, respectively, showing the bottom surfaces of the die-attach pad and studs. FIGS. 36A–36F, 37A–37F and 38A–38H contain cross-sectional views of the packages and views of the top surfaces of the die-attach pads and studs in the packages shown in FIGS. 36, 37 and 38, with the plated areas shown as hatched.

FIG. 36 shows a bottom view of the first, second and third packages, shown in FIGS. 36A–36B, 36C–36D and 36E–36F, respectively.

Figure 36A:
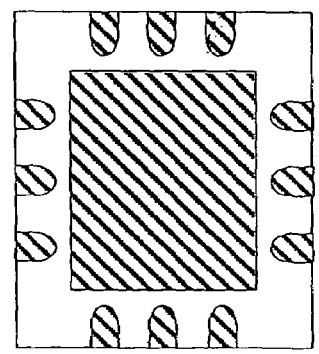
FIGS. 36A–36B illustrate a top view of the die-attach pad and studs and a cross-sectional view, respectively, of the first package.
Figure 36B:
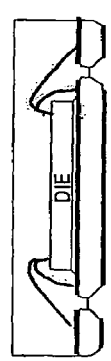
Figure 37E:
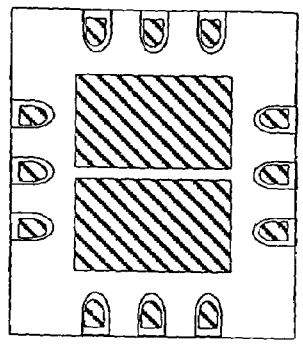
FIGS. 37E–37F illustrate a top view of the die-attach pad and studs and a cross-sectional view, respectively, of the sixth package.
Figure 37F:
Figure 37:
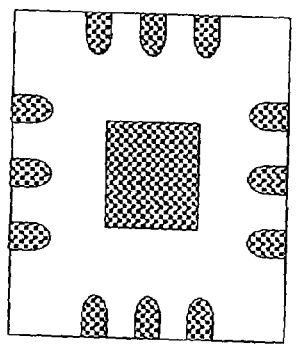
Figure 37C:
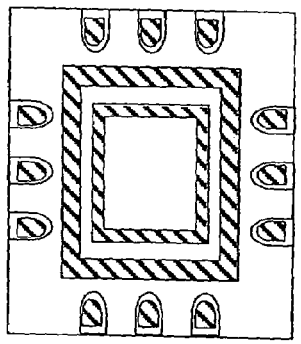
FIGS. 37C–37D illustrate a top view of the die-attach pad and studs and a cross-sectional view, respectively, of the fifth package.
Figure 37D:
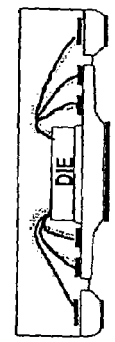

FIG. 36A shows a top view of the die-attach pad and studs in the first package, with the plated areas shown as cross-hatched. FIG. 36B is a cross-sectional view of the first package. The first package contains a single die and an array of 12 studs, three on each side of the package FIG. 36C shows a top view of the die-attach pad and studs in the second package, with the plated areas shown as cross-hatched. FIG. 36D is a cross-sectional view of the second package. The second package includes two dice mounted on a single die-attach pad. A plated bar and rings on the die-attach pad are used to control the length of the bonding wires.

FIG. 36E shows a top view of the die-attach pad and studs in the third package, with the plated areas shown as cross-hatched. FIG. 36F is a cross-sectional view of the third package. The third package includes a single die and plated rings on the die-attach pad to control the length of the bonding wires. While two rings are shown, three or more rings could also be formed. A number of bars could also be formed on the top surface of the die-attach pad.

FIG. 37 shows a bottom view of fourth, fifth and sixth packages, shown in FIGS. 37A–37B, 37C–37D and 37E–37F, respectively.

Figure 37A:
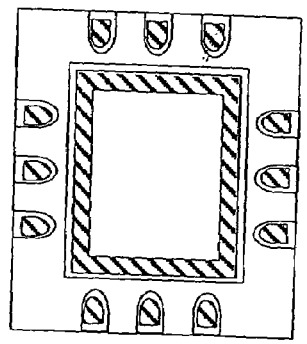
FIGS. 37A–37B illustrate a top view of the die-attach pad and studs and a cross-sectional view, respectively, of the fourth package.
Figure 37B:
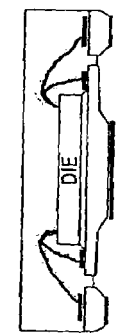
Figure 38:
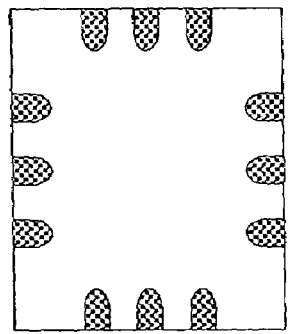

FIG. 37A shows a top view of the die-attach pad and studs in the fourth package, with the plated areas shown as cross-hatched. FIG. 37B is a cross-sectional view of the fourth package. The fourth package has a die-attach pad that contains a thin portion, a thick portion and a graduated transition portion similar to the die-attach pad in package 330, shown in FIGS. 29A–29B. A single plated ring is formed on the top surface of the die-attach pad, and the top surfaces of the studs are spot-plated.

FIG. 37C shows a top view of the die-attach pad and studs in the fifth package, with the plated areas shown as cross-hatched. FIG. 37D is a cross-sectional view of the fifth package. The fifth package has a die-attach pad that contains a thin portion, a thick portion and a graduated transition portion similar to the die-attach pad in package 330, shown in FIGS. 29A–29B. A pair of plated rings are formed on the top surface of the die-attach pad, and the top surfaces of the studs are spot-plated.

FIG. 37E shows a top view of the die-attach pad and studs in the sixth package, with the plated areas shown as cross-hatched. FIG. 37F is a cross-sectional view of the sixth package. The sixth package has a die-attach pad that contains a thin portion, a thick portion and a graduated transition portion similar to the die-attach pad in package 330, shown in FIGS. 29A–29B. Two dice are mounted on separate paddle areas of the die-attach pad that are separated by a groove in the top surface of the die-attach pad. The groove is formed by etching the die-attach pad halfway through from the top side. Alternatively, the die-attach pad could also be etched halfway through from the bottom side to yield two separate die-attach pads. Since the die-attach pad is normally grounded, whether to have a single grounded die-attach pad or two jointly-grounded die-attach pads is determined by the designer of the PCB on which the package is to be mounted.

FIG. 38 shows a bottom view of the seventh, eighth, ninth and tenth packages, shown in FIGS. 38A–38B, 38C–38D, 38E–38F and 38G–38H, respectively.

Figure 38A:
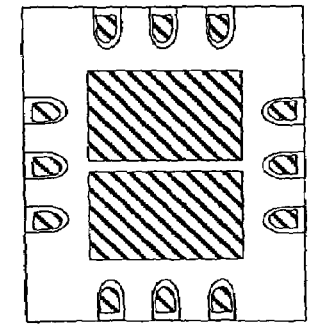
FIGS. 38A–38B illustrate a top view of the die-attach pad and studs and a cross-sectional view, respectively, of the seventh package.
Figure 38B:
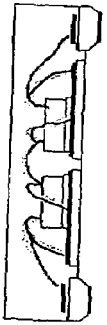

FIG. 38A shows a top view of the die-attach pad and studs in the seventh package, with the plated areas shown as cross-hatched. FIG. 38B is a cross-sectional view of the seventh package. The seventh package contains two dice mounted on separate die-attach pads that have been half-etched from the bottom side to isolate them from the underlying PCB.

Figure 38C:
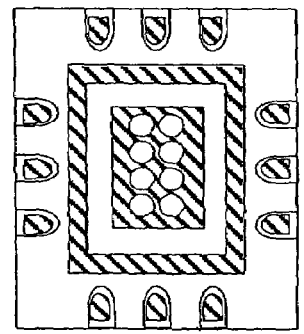
FIGS. 38C–38D illustrate a top view of the die-attach pad and studs and a cross-sectional view, respectively, of the eighth package.
Figure 38D:
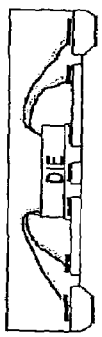

FIG. 38C shows a top view of the die-attach pad and studs in the eighth package, with the plated areas shown as cross-hatched. FIG. 38D is a cross-sectional view of the eighth package. The eighth package contains a single die mounted on a die-attach pad that is thinned by half-etching from the bottom side. A plurality of vias are formed under the area where the die is mounted by half-etching from the top side to release moisture vapor that might form in the die-attach layer to the outside of the package.

Figure 38E:
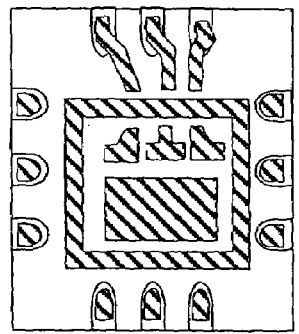
FIGS. 38E–38F illustrate a top view of the die-attach pad and studs and a cross-sectional view, respectively, of the ninth package.
Figure 38F:
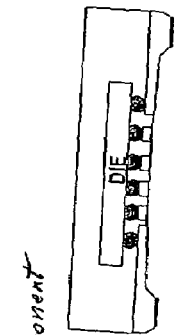

FIG. 38E shows a top view of the die-attach pad and studs in the ninth package, with the plated areas shown as cross-hatched. FIG. 38F is a cross-sectional view of the ninth package. The ninth package contains an additional component that is soldered into the package before the die is mounted to the die-attach pad and the wire bonds are formed. The component could be a capacitor, a resistor or a transistor, for example.

Figure 38G:
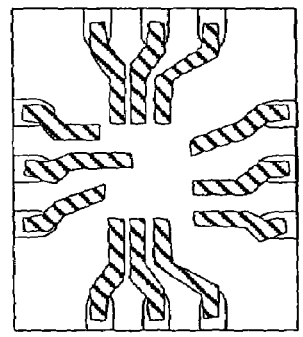
FIGS. 38G–38H illustrate a top view of the die-attach pad and studs and a cross-sectional view, respectively, of the tenth package.
Figure 38H:

FIG. 38G shows a top view of the die-attach pad and studs in tenth package, with the plated areas shown as cross-hatched. FIG. 38H is a cross-sectional view of the tenth package. The tenth package contains a die that is mounted with solder bumps flip-chip style to paddles that extend inward from the studs.

FIGS. 39A–39B, 40A–40B and 41A–41B illustrate packages 500, 510 and 520, respectively, that are fabricated by using a punch tool to separate the packages. Before the packages are separated, they are held together by tie bars 502, 512 and 522. Packages 530, 540 and 550, shown in FIGS. 42A–42B, 42A–43B and 44A–44B, respectively, are similar to packages 500, 510 and 520 except that the tie-bars are not connected to the die-attach pads. Instead, the "T" shaped elements at the corners of packages 530–540 and 550 are anchored in the molding compound and act as tie-bars by holding the packages together before they are separated with the punch tool. Using the structure of packages 530, 540 and 550, by eliminating the tie-bars that connect to the die-attach pads, provides more room for stud contacts or other components within the package.

A fabrication process for these packages is illustrated in FIGS. 45A–45G, which are cross-sectional views illustrating a process for fabricating packages similar to packages 510 and 540, shown in FIGS. 40A–40B and 43A–43B. The process begins with copper sheet 132. As shown in FIG. 45A, photoresist layers 401 and 403 are formed on the top and bottom surfaces, respectively, of sheet 132, and photoresist layer 401 is patterned as shown using a normal photolithographic process.

As shown in FIG. 45B, sheet 132 is half-etched through the openings in photoresist layer 410 to form mesas 405 and pillars 407. Photoresist layers 401 and 403 are then removed.

As shown in FIG. 45C, metal layers 409 are plated on the top surfaces of mesas 405 and pillars 407, and metal layers 411 and 412 are plated on the bottom surface of copper sheet 132. Metal layers 411 typically cover a wider area than metal layers 412. Metal layers 411 underlie alternative mesas 405, and openings 413 between certain ones of metal layers 412 are formed under the remaining mesas 405.

As shown in FIG. 45D, each of the dice 111 is attached to sheet 132 on top of alternate ones of mesas 405 by epoxy layer 112, which adheres to the top surface of metal layer 409. The mesas 405 to which dice 111 are attached are the ones over which metal layers 411 are formed. Using a wire bonding machine, wire bonds 117 are made between locations on the dice 111 and the plated areas on the top surfaces of pillars 405 and mesas 407.

As shown in FIG. 45E, capsules 415, made of a plastic molding compound, are formed on the top surface of copper sheet 132, covering the pillars 407 the dice 111 and the bonding wires 117. The mold machine is designed such that there are separate cavities over the locations of the individual packages. As a result, packages having the rectangular shape and truncated corners shown in FIGS. 39B–44B are formed. Molding equipment capable of providing separate cavities is available from many sources, including FICO, TOWA, Daiichi and ASM.

As shown in FIG. 45F, copper sheet 132 is etched from the bottom, removing all portions of copper sheet 132 except for those covered by metal layers 411 and forming metal studs 417 and die-attach pads 419. The etching process is stopped soon enough that segments 421 of metal sheet 132 remain. Metal sheet 132 is not etched all the way through, and segments 421 link the structures (including dice 111, die-attach pads 419 and studs 417) that are held together by each of capsules 415. At this stage, tie-bars 502, 512 and 522 still hold packages 500, 510 and 520 together and the "T" shaped elements are embedded in the capsules 415 and hold packages 530, 540 and 550 together.

Finally, as shown in FIG. 45G, a punch tool is used to separate packages 510 and 540 in both directions. Because separate bodies of molding compound have been formed over each of the packages (see FIG. 45E) the punch tool needs to cut through only a layer of copper and possibly a thin residual layer of molding compound. Punch tools capable of performing this function are available from FICO, TOWA, GPM, ASM, SUNTEC and HANMI.

Figure 46D:
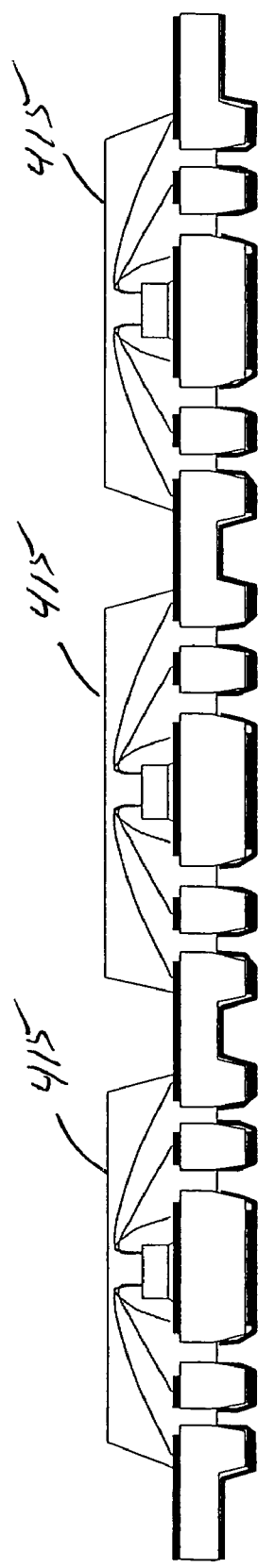
Figure 46E:
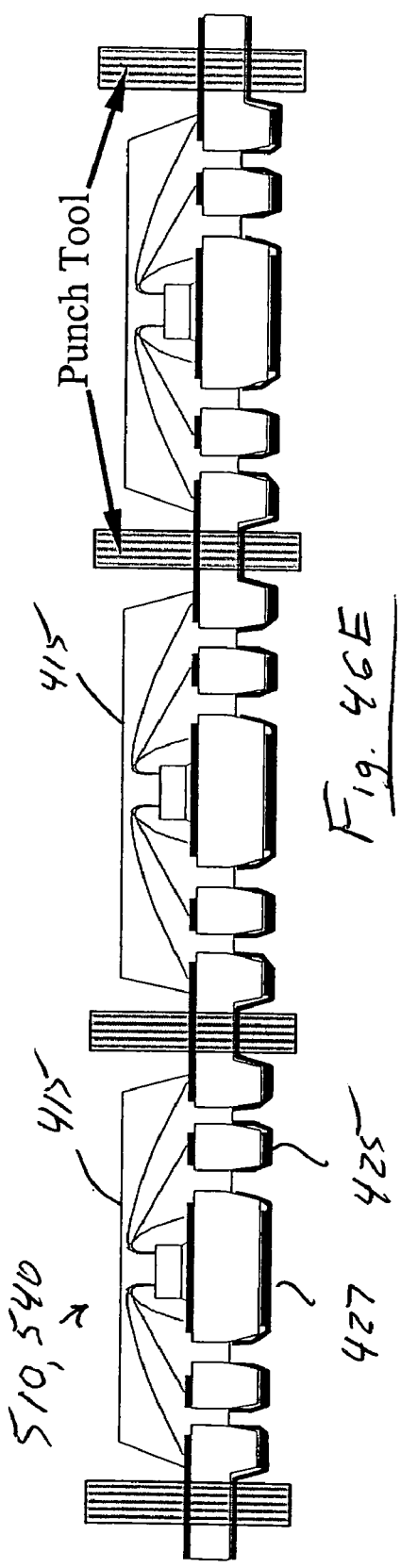

FIGS. 46A–46E illustrate a variation of the above process whereby the studs and exposed plated layers are subjected to an additional plating process. FIGS. 46A–46C correspond to FIGS. 45D–45F and show the process through the formation of metal studs 417 and die-attach pads 419. Next, as shown in FIG. 46D, plated layers 425 are formed on the exposed surfaces of the metal studs 417, and plated layers 427 are formed on the exposed surfaces of die-attach pads 419. Finally packages 510 and 540, containing the additional plated layers 425 and 427 are separated with a punch tool, as shown in FIG. 46E.

Although numerous embodiments of this invention have been described above, it will be understood that these embodiments are illustrative only, and not limiting. Many additional embodiments according to the broad principles of this invention will be apparent to persons of skill in the art.

We claim:

1. A semiconductor die package comprising:
   a semiconductor die;
   a molded plastic capsule enclosing said die;
   a plurality of metal studs, each of said metal studs protruding from a bottom surface of said molded plastic capsule such that said bottom surface of said molded plastic capsule is exposed between said metal studs, each of said metal studs having a flat bottom surface; and
   a plurality of bonding wires, each of said bonding wires extending between a first bonding location on said die and a second bonding location adjacent an upper surface of one of said metal studs, said bonding wires and bonding locations being embedded within said molded plastic capsule;
   wherein said studs comprise a first metal, a layer of a second metal being formed on said flat bottom surfaces of said studs.

2. The semiconductor die package of claim 1 wherein said first metal is a copper alloy and said second metal comprises nickel.

3. The semiconductor die package of claim 1 comprising a second layer of said second metal formed on said upper surface of each of said studs.

4. The semiconductor die package of claim 1 wherein said studs are arranged in a single row on at least one side of said die.

5. The semiconductor die package of claim 1 wherein said studs are arranged in a plurality of rows on at least one side of said die.

6. The semiconductor die package of claim 1 wherein said layer of a second metal is a Ni layer, said package further comprising a Pd layer on said Ni layer and an Au layer on said Pd layer.

7. The semiconductor die package of claim 1 comprising a die-attach pad, said semiconductor die being attached to said die-attach pad.

8. The semiconductor die package of claim 7 wherein said die is attached to said die-attach pad by means of an epoxy layer and a plated metal layer.

9. The semiconductor die package of claim 7 comprising a metal layer plated on a bottom surface of said die-attach pad.

10. The semiconductor die package of claim 7 wherein said die-attach pad is of substantially the same thickness as the studs.

11. The semiconductor die package of claim 7 wherein a lateral dimension of said die-attach pad is smaller than a lateral dimension of said die.

12. The semiconductor die package of claim 7 wherein a cavity is formed in an upper surface of said die-attach pad, said die being positioned in said cavity.

13. The semiconductor die package of claim 7 comprising a plurality of semiconductor dice and a plurality of die-attach pads, each of said dice being mounted on one of said die-attach pads.

14. The semiconductor die package of claim 7 wherein said die-attach pad has a thicker portion and a thinner portion said thicker and thinner portions being connected by a graduated step on a bottom surface of said die-attach pad.

15. The semiconductor die package of claim 7 wherein said die-attach pad is slotted.

16. The semiconductor die package of claim 7 wherein said die-attach pad protrudes from said bottom surface of said molded plastic capsule, a plated metal layer being formed on a bottom surface of said die-attach pad.

17. The semiconductor die package of claim 7 wherein said die-attach pad is thinner than said studs.

18. The semiconductor die package of claim 15 wherein a bottom surface of said die-attach pad is substantially coplanar with said bottom surface of said capsule.

19. The semiconductor die package of claim 17 wherein said die-attach pad is approximately one-half as thick as said studs.

20. A semiconductor die package comprising:
a semiconductor die;
a capsule enclosing said die;
a plurality of metal studs, each of said metal studs protruding from a bottom surface of said capsule, each of said metal studs having a flat bottom surface; and
a plurality of bonding wires, each of said bonding wires extending between a first bonding location on said die and a second bonding location adjacent an upper surface of one of said metal studs, said bonding wires and bonding locations being embedded within said capsule;
wherein said studs comprise a first metal, a layer of a second metal being formed on said flat bottom surfaces of said studs, wherein said first metal is a copper alloy and wherein said second metal comprises Ni/Pd/Au.

21. A semiconductor die package comprising:
a semiconductor die;
a capsule enclosing said die;
a plurality of metal studs, each of said metal studs protruding from a bottom surface of said capsule, each of said metal studs having a flat bottom surface; and
a plurality of bonding wires, each of said bonding wires extending between a first bonding location on said die and a second bonding location adjacent an upper surface of one of said metal studs, said bonding wires and bonding locations being embedded within said capsule;
wherein lateral surfaces of the portions of said studs that protrude from said bottom surface of said capsule are beveled.

22. A semiconductor die package comprising:
a semiconductor die;
a capsule enclosing said die;
a plurality of metal studs, each of said metal studs protruding from a bottom surface of said capsule, each of said metal studs having a flat bottom surface; and
a plurality of bonding wires, each of said bonding wires extending between a first bonding location on said die and a second bonding location adjacent an upper surface of one of said metal studs, said bonding wires and bonding locations being embedded within said capsule;
wherein said die rests on a layer of epoxy, a bottom surface of said layer of epoxy being exposed at a bottom of said package.

23. The semiconductor die package of claim 22 wherein a plane defined by said bottom surface of said layer of epoxy is located above a plane defined by said flat bottom surfaces of said metal studs.

24. The semiconductor die package of claim 23 wherein said bottom surface of said layer of epoxy is coplanar with a bottom surface of said capsule.

25. A semiconductor die package comprising:
a semiconductor die;
a capsule enclosing said die;
a plurality of metal studs, each of said metal studs protruding from a bottom surface of said capsule, each of said metal studs having a flat bottom surface; and
a plurality of bonding wires, each of said bonding wires extending between a first bonding location on said die and a second bonding location adjacent an upper surface of one of said metal studs, said bonding wires and bonding locations being embedded within said capsule;
wherein said die rests on a layer of epoxy, said layer of epoxy being attached to a plated metal layer, a bottom surface of said plated metal layer being exposed at a bottom of said package.

26. The semiconductor die package of claim 25 wherein a lateral dimension of said plated metal layer is greater than a lateral dimension of said die.

27. The semiconductor die package of claim 25 wherein a plane defined by said bottom surface of said plated metal layer is located above a plane defined by said flat bottom surfaces of said metal studs.

28. The semiconductor die package of claim 27 wherein said bottom surface of said plated metal layer is coplanar with a bottom surface of said capsule.

29. A semiconductor die package comprising:
a semiconductor die;
a die-attach pad, said semiconductor die being attached to said die-attach pad, a lateral dimension of said die-attach pad being smaller than a lateral dimension of said die;
a capsule enclosing said die;
a plurality of metal studs, each of said metal studs protruding from a bottom surface of said capsule, each of said metal studs having a flat bottom surface; and
a plurality of bonding wires, each of said bonding wires extending between a first bonding location on said die and a second bonding location adjacent an upper surface of one of said metal studs, said bonding wires and bonding locations being embedded within said capsule;
wherein said die is attached to said die-attach pad by means of an epoxy layer and a plated metal layer, said plated metal layer having a lateral dimension larger than said lateral dimension of said die.

30. The semiconductor die package of claim 29 wherein a portion of a lower surface of said plated metal layer is exposed.

31. A semiconductor die package comprising:
a semiconductor die;
a die-attach pad, said semiconductor die being attached to said die-attach pad;
a capsule enclosing said die;
a plurality of metal studs, each of said metal studs protruding from a bottom surface of said capsule, each of said metal studs having a flat bottom surface; and
a plurality of bonding wires, each of said bonding wires extending between a first bonding location on said die and a second bonding location adjacent an upper surface of one of said metal studs, said bonding wires and bonding locations being embedded within said capsule;
wherein a moat is formed in an upper surface of said die-attach pad, said moat surrounding said die.

32. A semiconductor die package comprising:
a semiconductor die;
a capsule enclosing said die; and
a plurality of metal studs, each of said metal studs protruding from a bottom surface of said capsule, each of said metal studs having a flat bottom surface, said die being mounted on said studs by means for solder balls, each of said solder balls making an electrical connection between a location on said die and one of said studs, said solder balls being embedded within said capsule.

33. The semiconductor die package of claim 32 wherein some or all of said studs comprise a shelf portion, said solder balls being in contact with said shelf portions.

34. The semiconductor die package of claim 32 further comprising a die-attach pad, said die being mounted on said die-attach pad by means of one or more solder balls.

35. A process of fabricating a semiconductor die package comprising:

providing a metal sheet;

forming a first mask layer on a first side of said metal sheet:

partially etching said metal sheet through openings in said first mask layer;

attaching a semiconductor die to a location on said first side of said metal sheet;

applying a layer of a molding compound over said first side of said metal sheet;

forming a second mask layer on a second side of said metal sheet; and partially etching said metal sheet through openings in said second mask layer to form a plurality of studs.

36. The method of claim 35 wherein forming a first mask layer comprises forming a photoresist layer and photolithographically patterning said photoresist layer.

37. The method of claim 35 wherein forming a second mask layer comprises plating a metal layer.

\* \* \* \* \*